(12) United States Patent
Hamamoto

(10) Patent No.: US 9,406,720 B2
(45) Date of Patent: Aug. 2, 2016

(54) SEMICONDUCTOR STORAGE DEVICE

(71) Applicant: KABUSHIKI KAISHA TOSHIBA, Minato-ku, Tokyo (JP)

(72) Inventor: Takeshi Hamamoto, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/645,209

(22) Filed: Mar. 11, 2015

(65) Prior Publication Data
US 2016/0043134 A1 Feb. 11, 2016

Related U.S. Application Data

(60) Provisional application No. 62/035,824, filed on Aug. 11, 2014.

(51) Int. Cl.
| | |
|---|---|
| *H01L 29/82* | (2006.01) |
| *H01L 27/22* | (2006.01) |
| *H01L 43/02* | (2006.01) |
| *H01L 43/08* | (2006.01) |

(52) U.S. Cl.
CPC .............. *H01L 27/222* (2013.01); *H01L 43/02* (2013.01); *H01L 43/08* (2013.01)

(58) Field of Classification Search
CPC ........ H01L 27/222; H01L 43/02; H01L 43/08
USPC ....................................................... 257/421
See application file for complete search history.

(56) References Cited

U.S. PATENT DOCUMENTS

| | | |
|---|---|---|
| 6,584,011 B2 | 6/2003 | Watanabe |
| 7,184,301 B2 | 2/2007 | Sugibayashi et al. |

(Continued)

FOREIGN PATENT DOCUMENTS

| | | |
|---|---|---|
| JP | 2004-348934 A | 12/2004 |
| JP | 2007-317795 A | 12/2007 |

(Continued)

OTHER PUBLICATIONS

Hosomi, M., et al., "A Novel Nonvolatile Memory with Spin Torque Transfer Magnetization Switching: Spin-Ram", IEDM 2005 Technical Digest, p. 473-476.

(Continued)

*Primary Examiner* — Bradley K Smith
(74) *Attorney, Agent, or Firm* — Knobbe, Martens, Olson & Bear, LLP

(57) ABSTRACT

A memory includes first to fifth WLs extending in a first-direction. First to fourth element-regions extend in a tilt-direction. The first to fourth element-regions, respectively, intersect with the first and second WLs, with the third and fourth WLs, with the second and third WLs, and with the fourth and fifth WLs. A first connection-portion is arranged on an end of the first element-region and an end of the second element-region between the second and third WLs. A second connection-portion is arranged on an end of the third element-region and an end of the fourth element-region between the third and fourth WLs. First to fourth MTJs are, respectively, arranged above the first to fourth element-regions. The first and second MTJs are on a substantially same line along a second direction orthogonal to the first direction. The third and fourth MTJs are on a substantially same line along the second direction.

20 Claims, 23 Drawing Sheets

(56) References Cited

U.S. PATENT DOCUMENTS

| | | |
|---|---|---|
| 7,548,450 B2 | 6/2009 | Aoki |
| 7,969,768 B2 | 6/2011 | Takizawa et al. |
| 8,208,292 B2 | 6/2012 | Kai et al. |
| 8,513,751 B2 | 8/2013 | Asao |
| 8,542,519 B2 | 9/2013 | Asao et al. |
| 2003/0103393 A1 | 6/2003 | Asao |
| 2004/0084702 A1 | 5/2004 | Jeong |
| 2006/0256611 A1 | 11/2006 | Bednorz et al. |
| 2006/0266470 A1 | 11/2006 | Koga |
| 2007/0279963 A1 | 12/2007 | Tsuchida et al. |
| 2008/0035958 A1 | 2/2008 | Asao |
| 2008/0043514 A1 | 2/2008 | Ueda |
| 2008/0164502 A1* | 7/2008 | Fukumoto ............... G11C 11/16 257/295 |
| 2008/0203503 A1 | 8/2008 | Asao |
| 2008/0239782 A1* | 10/2008 | Asao ...................... G11C 5/025 365/63 |
| 2008/0239796 A1 | 10/2008 | Aoki |
| 2008/0308887 A1* | 12/2008 | Asao ...................... B82Y 10/00 257/421 |
| 2009/0014703 A1 | 1/2009 | Inaba |
| 2010/0103718 A1 | 4/2010 | Asao |
| 2010/0237321 A1 | 9/2010 | Inaba |
| 2011/0017971 A1* | 1/2011 | Kim ................... H01L 27/10876 257/5 |
| 2011/0069534 A1 | 3/2011 | Inaba |
| 2012/0063216 A1 | 3/2012 | Fujita et al. |
| 2012/0153414 A1 | 6/2012 | Shuto |
| 2012/0314469 A1 | 12/2012 | Shuto |
| 2013/0265814 A1* | 10/2013 | Shin ........................ G11C 5/08 365/67 |
| 2014/0117477 A1* | 5/2014 | Park ...................... H01L 27/228 257/421 |
| 2014/0233305 A1* | 8/2014 | Kim .................... G11C 11/1673 365/158 |
| 2014/0254239 A1* | 9/2014 | Song ..................... H01L 27/228 365/148 |
| 2014/0284738 A1* | 9/2014 | Nakazawa ............ H01L 27/228 257/421 |

FOREIGN PATENT DOCUMENTS

| | | |
|---|---|---|
| JP | 2008-192636 | 8/2008 |
| JP | 2008-192990 A | 8/2008 |
| JP | 2011-211148 A | 10/2011 |
| JP | 2012-129470 A | 7/2012 |
| JP | 2012-256693 A | 12/2012 |

OTHER PUBLICATIONS

Slonczewski, J.C., "Current-Driven Excitation of Magnetic Multilayers", Journal of Magnetism and Magnetic Materials 159 (1996) L1-L7, 7 pages.

Tsuchida, et al., "A 64Mb MRAM with Clamped-Reference and Adequate-Reference Schemes", ISSCC 2010 IEEE/ Session 14/ Non-Volatile Memory / 14.2, pp. 258-260.

Background Art Information (Concise Explanation for JP 2008-192990 A), Feb. 17, 2010.

* cited by examiner

SEMICONDUCTOR STORAGE DEVICE

CROSS REFERENCE TO RELATED APPLICATIONS

This application is based upon and claims the benefit of priority from the prior Provisional U.S. Patent Application No. 62/035,824, filed on Aug. 11, 2014, the entire contents of which are incorporated herein by reference.

FIELD

The embodiments of the present invention relate to a semiconductor storage device.

BACKGROUND

One type of resistive random access memories is an MRAM (Magnetic Random Access Memory). In an MRAM, each memory cell is sometimes constituted of one MTJ (Magnetic Tunnel Junction) element and one select transistor. In such a 1T-1MTJ memory cell, one of diffusion layers of the select transistor is connected to a source line via a source line contact. The other diffusion layer of the select transistor is connected to a lower end of the MTJ element via a bottom electrode contact. An upper end of the MTJ element is connected to a bit line via a top electrode contact and a top electrode wire.

Such a case has a problem that there is only a small allowance in misalignment between the top electrode contact and the top electrode wire. Furthermore, two top electrode contacts share one top electrode wire and are connected to a bit line via the top electrode wire. However, the top electrode wire does not cover the entire upper surfaces of the top electrode contacts and is connected only to parts of the upper surfaces. This is because adjacent ones of top electrode wires may be short-circuited with each other if each of the top electrode wires covers the entire upper surfaces of the corresponding top electrode contacts. However, because each of the top electrode wires is connected only to parts of the upper surfaces of the corresponding top electrode contacts, a parasitic resistance between the top electrode wires and the top electrode contacts is adversely increased.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor storage device according to an embodiment comprises first to fifth word lines extending in a first direction and adjoining in an order from the first to fifth word lines. First to fourth element regions extend in a tilt direction tilted with respect to the first direction, being on first to fourth lines adjoining in an order from the first to fifth lines, respectively, and are isolated from each other by element isolation regions. The first element region intersects with at least the first and second word lines, the second element region intersects with at least the third and fourth word lines, the third element region intersects with at least the second and third word lines, and the fourth element region intersects with at least the fourth and fifth word lines. A first connection portion is arranged on an end of the first element region and an end of the second element region between the second word line and the third word line. A second connection portion is arranged on an end of the third element region and an end of the fourth element region between the third word line and the fourth word line. A first MTJ element is arranged above the first element region between the first word line and the second word line. A second MTJ element is arranged above the second element region between the third word line and the fourth word line. A third MTJ element is arranged above the third element region between the second word line and the third word line. A fourth MTJ element is arranged above the fourth element region between the fourth word line and the fifth word line. The first MTJ element and the second MTJ element are on a substantially same line along a second direction orthogonal to the first direction. The third MTJ element and the fourth MTJ element are on a substantially same line along the second direction.

First Embodiment

Figure 1:
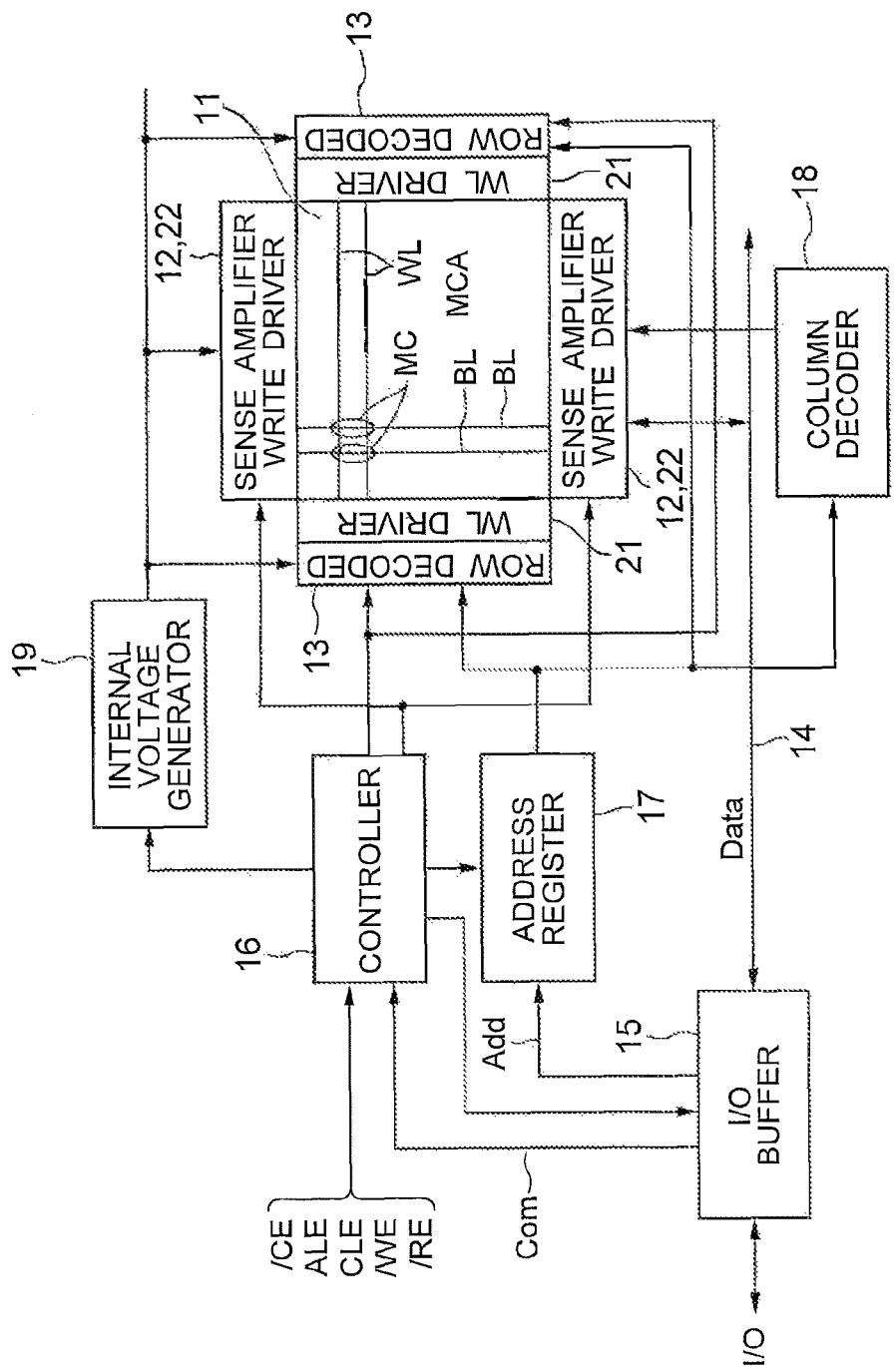
FIG. 1 is a block diagram showing a configuration of an MRAM according to a first embodiment.

FIG. 1 is a block diagram showing a configuration of an MRAM according to a first embodiment. A plurality of memory cells MC are two-dimensionally arranged in a matrix within a memory cell array 11. Each of the memory cells MC includes an MTJ element and a cell transistor. The MTJ element is a magnetic tunnel junction element that can store therein data according to a change in a resistance state and can rewrite data thereto according to a current. The cell transistor is provided to correspond to the MTJ element and is configured to be in a conduction state when a current is caused to flow to the corresponding MTJ element.

A plurality of word lines WL are arranged in a row direction and a plurality of bit lines BL are arranged in a column direction in such a manner that the word lines WL and the bit lines BL intersect with each other. The memory cells MC are provided to correspond to intersections between two word lines WL and one bit line BL, respectively.

A sense amplifier 12 and a write driver 22 are arranged on either side of the memory cell array 11 in a bit line direction. The sense amplifiers 12 are connected to the bit lines BL and detect currents flowing in memory cells MC connected to a selected word line WL, thereby reading data stored in the memory cells MC. The write drivers 22 are connected to the bit lines BL and flow a current to memory cells MC connected to a selected word line WL, thereby writing data thereto.

A row decoder 13 and a word line driver 21 are arranged on either side of the memory cell array 11 in a word line direction. The word line drivers 21 are connected to the word lines WL and are configured to apply a voltage to a selected word line WL during data read or data write.

Data is transmitted and received between the sense amplifiers 12 or the write drivers 22 and an external input/output terminal I/O via a data bus 14 and an I/O buffer 15.

Various external control signals such as a chip enable signal /CE, an address latch enable signal ALE, a command latch enable signal CLE, a write enable signal /WE, and a read enable signal /RE are input to a controller 16. The controller 16 discriminates between an address Add and a command Com supplied through the input/output terminal I/O based on these control signals. The controller 16 transfers the address Add to the row decoders 13 and a column decoder 18 via an address register 17. The sense amplifiers 12 are configured to be capable of applying a voltage to a bit line BL according to a column address decoded by the column decoder 18. The word line drivers 21 are configured to be capable of applying a voltage to a selected word line WL according to a row address decoded by the row decoders 13.

The controller 16 executes sequence controls including data read, data write, and erase according to the external control signals and the command Com. An internal voltage generator 19 is provided to generate internal voltages required for the above operations (a voltage stepped up/down from a power supply voltage, for example). The internal voltage generator 19 is also controlled by the controller 16 and performs a boost operation to generate a required voltage.

Figure 2:
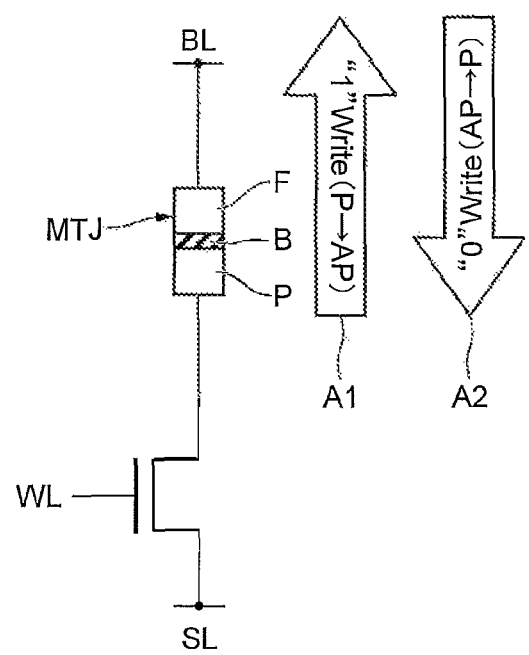
FIG. 2 is an explanatory diagram showing a data writing operation of a memory cell MC according to the present embodiment.

FIG. 2 is an explanatory diagram showing a data writing operation of a memory cell MC according to the present embodiment. The MTJ element of the memory cell MC is connected to a bit line BL and the cell transistor CT thereof is connected to a source line SL. A gate of the cell transistor CT is connected to a word line WL. The MTJ element utilizing a TMR (tunneling magnetoresistive) effect has a stacked layer structure including two ferromagnetic layers F and P and a nonmagnetic layer (a tunneling dielectric film) B interposed therebetween and stores therein digital data according to a change in a magnetic resistance caused by a spin-polarized tunneling effect. The MTJ element can have a low resistance state and a high resistance state according to magnetization arrays of the ferromagnetic layers F and P. For example, when the low resistance state is defined as data "0" and the high resistance state is defined as data "1", 1-bit data can be recorded in the MTJ element. Of course, it is alternatively possible to define the low resistance state as "1" and define the high resistance state as "0".

The MTJ element is constituted by sequentially stacking a fixed layer (a pinned layer) P, a tunneling barrier layer B, a recording layer (a free layer) F on top of another. The pinned layer P and the free layer F are constituted of a ferromagnetic body and the tunneling barrier layer B is made of an insulating film ($Al_2O_3$ or MgO, for example). The pinned layer P is a layer in which the direction of the magnetization array is fixed and the free layer F is a layer in which the direction of the magnetization array is variable and stores therein data according to the magnetization direction.

When a current is caused to flow in a direction shown by an arrow A1 at the time of data writing, the magnetization direction of the free layer F becomes an anti-parallel state (an AP state) with respect to that of the pinned layer P and the MTJ element has the high resistance state (data "1"). When a current is caused to flow in a direction shown by an arrow A2 at the time of data writing, the magnetization directions of the pinned layer P and the free layer F become a parallel state (a P state) and thus the MTJ element has the low resistance state (data "0"). In this way, different data can be written to the MTJ element depending on the direction in which a current is caused to flow.

Figure 3:
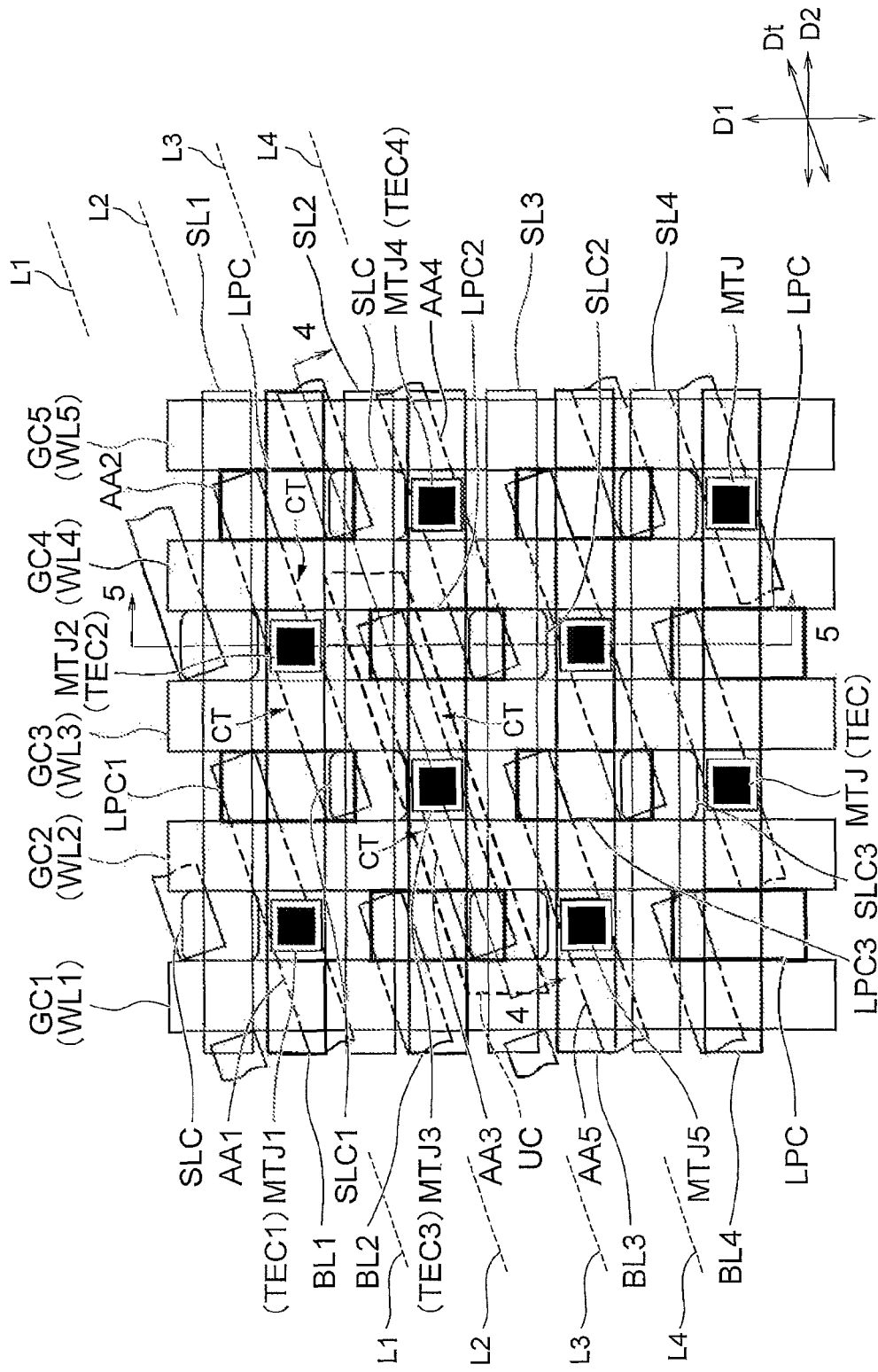
FIG. 3 is a planar layout chart showing an example of a configuration of the MRAM according to the first embodiment.
Figure 4:
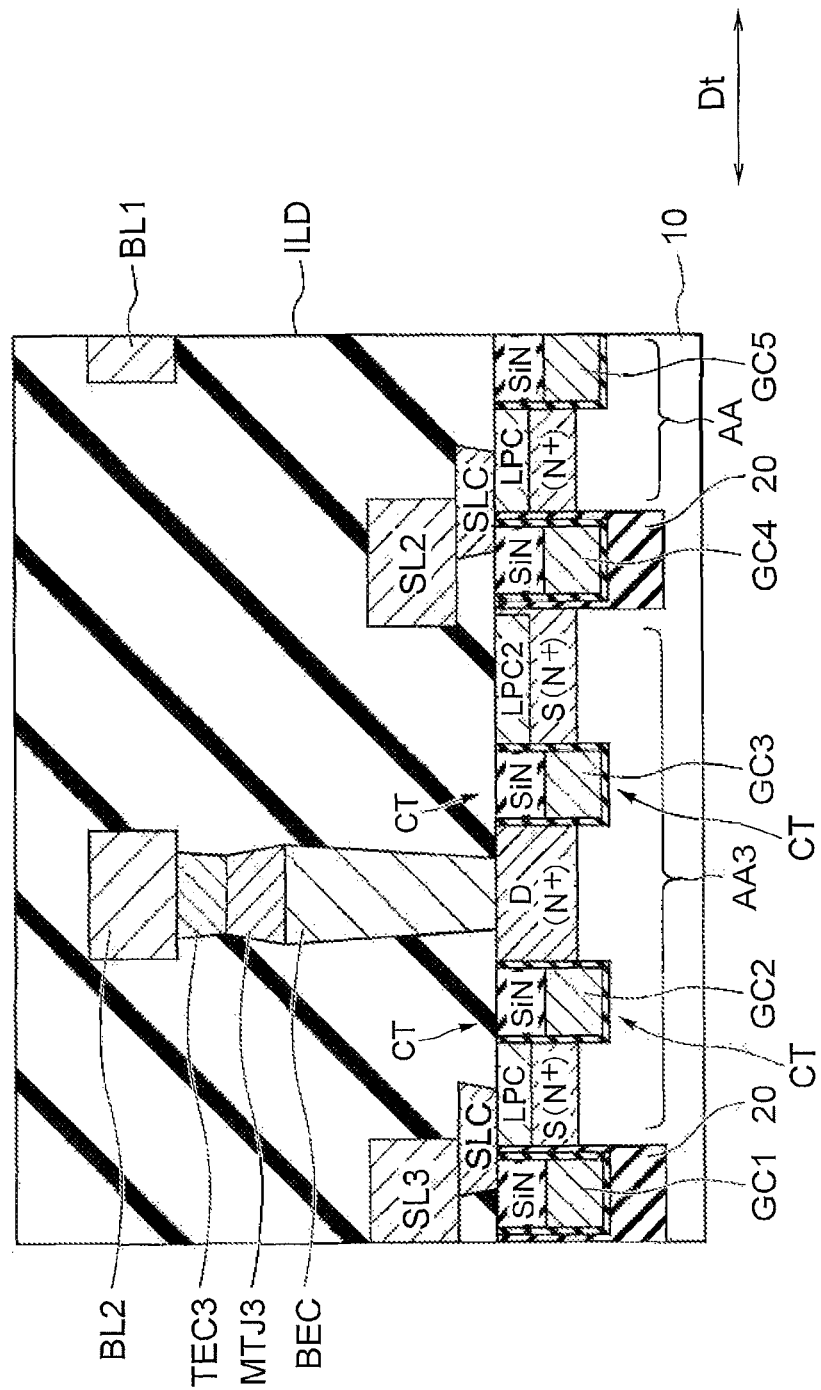
FIG. 4 is a cross-sectional view along a line 4-4 (active areas AA) in FIG. 3.
Figure 5:
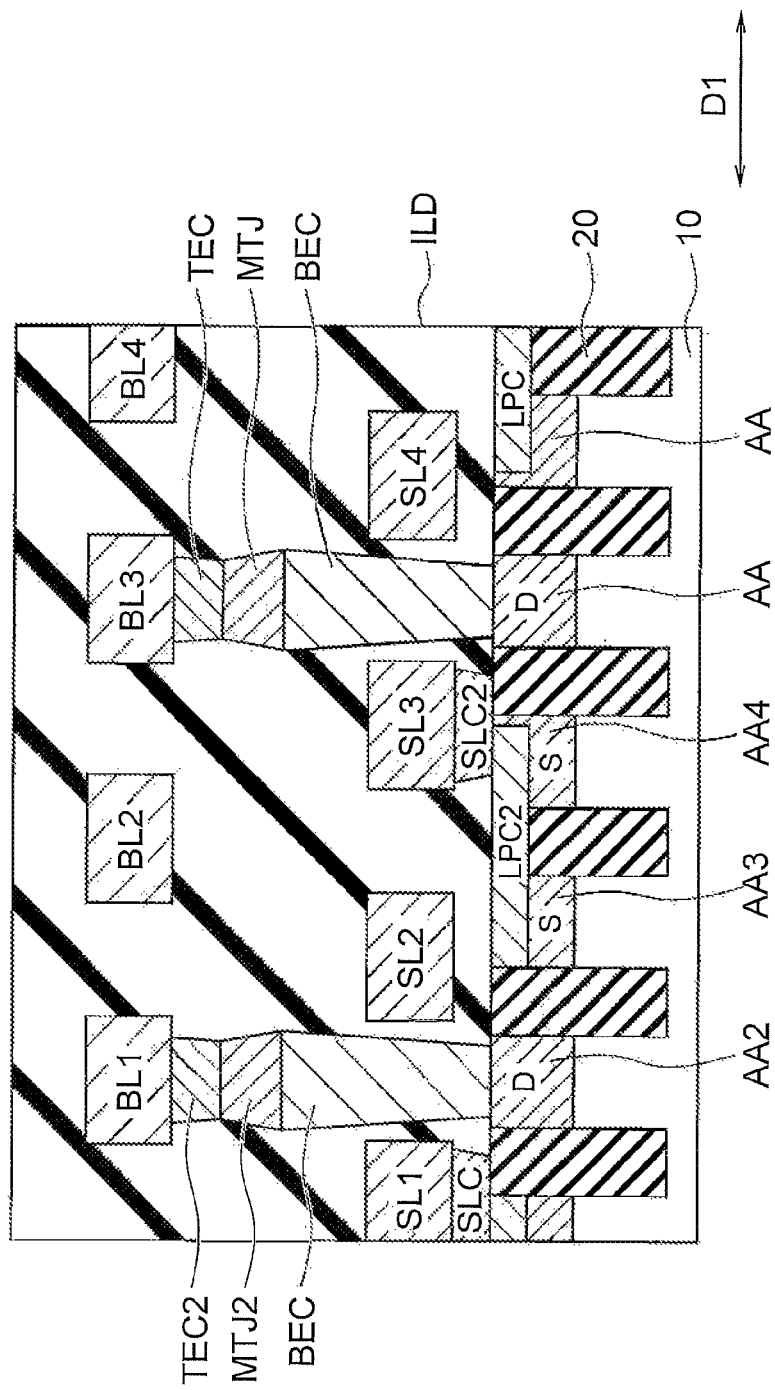
FIG. 5 is a cross-sectional view along a line 5-5 (gate electrodes GC) in FIG. 3.

FIG. 3 is a planar layout chart showing an example of a configuration of the MRAM according to the first embodiment. FIG. 4 is a cross-sectional view along a line 4-4 (active areas AA) in FIG. 3. FIG. 5 is a cross-sectional view along a line 5-5 (gate electrodes GC) in FIG. 3.

As shown in FIG. 3, an extending direction of gate electrodes GC is denoted by D1 (a first direction) and an extending direction of the bit lines BL substantially orthogonal to the first direction D1 is denoted by D2 (a second direction). An extending direction of active areas AA tilted with respect to the directions D1 and D2 is denoted by Dt (a tilt direction).

The MRAM according to the present embodiment includes first to fifth gate electrodes GC (word lines WL), bit lines BL, source lines SL, active areas AA, MTJ elements MTJ, landing pad contacts LPC, source line contacts SLC, bottom electrode contacts BEC, and top electrode contacts TEC. For easier understanding, numerals may be given to reference characters of the constituent elements.

As shown in FIG. 3, first to fifth gate electrodes GC1 to GC5 extend in the direction D1 and are arranged to adjoin each other in an order from the first to fifth ones. For example, the first to fifth gate electrodes GC1 to GC5 are arrayed in an order of GC1, GC2, GC3, GC4, and GC5 in the direction D2. The first to fifth gate electrodes GC1 to GC5 have functions as gates of cell transistors CT and functions as word lines WL1 to WL5, respectively.

Bit lines BL1 to BL4 and source lines SL1 to SL4 extend in the direction D2 and are arranged alternately in a planar layout seen from the top of a semiconductor substrate. For example, the bit lines BL1 to BL4 and the source lines SL1 to SL4 are arrayed in an order of SL1, BL1, SL2, BL2, SL3, BL3, SL4, and BL4 in the direction D1.

Active areas AA1 to AA5 extend in the direction Dt and are isolated from each other by shallow trench isolations. MTJ elements MTJ1 to MTJ5 are arranged above central portions of the active areas AA1 to AA5, respectively. The MTJ elements MTJ1 and MTJ2 are provided on a same line in the direction D2 and are arranged below the bit line BL1. The MTJ elements MTJ3 and MTJ4 are provided on a same line in the direction D2 and are arranged below the bit line BL2. The MTJ elements MTJ1 and MTJ5 are provided on a same line in the direction D1 and are both arranged between the word lines WL1 and WL2. The MTJ element MTJ5 is arranged below the bit line BL3. A distance between the MTJ elements MTJ1 and MTJ2 is substantially equal to that between the MTJ elements MTJ3 and MTJ4. The distance between the MTJ elements MTJ1 and MTJ2 is substantially equal to that between the MTJ elements MTJ1 and MTJ5. The cell transistors CT are provided on both sides of each of the MTJ elements MTJ1 to MTJ5 in the corresponding active area AA, respectively.

The active areas AA1 to AA4 extend in the direction Dt and are provided on first to fourth lines L1 to L4 adjoining each other in an order from the first to fourth ones, respectively. The first to fourth lines L1 to L4 are imaginary lines adjoining each other in the order from the first to fourth ones. The active area AA1 intersects with at least the first and second gate electrodes GC1 and GC2. The active area AA2 intersects with at least the third and fourth gate electrodes GC3 and GC4. The active area AA3 intersects with at least the second and third gate electrodes GC2 and GC3. The active area AA4 intersects with at least the fourth and fifth gate electrodes GC4 and GC5. The active area AA5 is provided on the fourth line L4 and intersects with at least the first and second gate electrodes GC1 and GC2.

A landing pad contact LPC1 serving as a first connection portion is arranged on an end of the active area AA1 and an end of the active area AA2 between the second gate electrode GC2 and the third gate electrode GC3. Accordingly, the landing pad contact LPC1 electrically connects the active area AA1 and the active area AA2 to each other.

A landing pad contact LPC2 serving as a second connection portion is arranged on an end of the active area AA3 and an end of the active area AA4 between the third gate electrode GC3 and the fourth gate electrode GC4. Accordingly, the landing pad contact LPC2 electrically connects the active area AA3 and the active area AA4 to each other.

A source line contact SLC1 is arranged on an end of the landing pad contact LPC1 between the second gate electrode GC2 and the third gate electrode GC3. Accordingly, the source line contact SLC1 electrically connects the landing pad contact LPC1 and the source line SL2 to each other.

A source line contact SLC2 is arranged on an end of the landing pad contact LPC2 between the third gate electrode GC3 and the fourth gate electrode GC4. The source line contact SLC2 electrically connects the landing pad contact LPC2 and the source line SL3 to each other.

The bit lines BL1 to BL4 are provided above a plurality of the MTJ elements arrayed in the direction D2 and are electrically connected in common to upper ends of the MTJ elements, respectively. For example, the bit line BL1 is provided above the MTJ elements MTJ1 and MTJ2 and is electrically connected to upper ends of the MTJ elements MTJ1 and MTJ2. The bit line BL2 is provided above the MTJ elements MTJ3 and MTJ4 and is electrically connected to upper ends of the MTJ elements MTJ3 and MTJ4. The bit line BL3 is provided above the MTJ element MTJ5 and is electrically connected to an upper end of the MTJ element MTJ5.

The source lines SL1 to SL4 are provided on a plurality of source line contacts SLC arrayed in the direction D2 and are electrically connected to ends of a plurality of the active areas AA via the source line contacts SLC and the landing pad contacts LPC, respectively. For example, the source line SL2 is electrically connected to ends of two active areas AA1 and AA2 via the source line contact SLC1 and the landing pad contact LPC1. The source line SL3 is electrically connected to ends of two active areas AA3 and AA4 via the source line contact SLC2 and the landing pad contact LPC2. The source line SL4 is electrically connected to ends of two active areas including the active area AA5 via the source line contact SLC3 and the landing pad contact LPC3. In this way, the both ends (sources of the corresponding cell transistors CT) of each of the active areas AA1 to AA5 are connected to any of the source lines SL1 to SL4. For example, the both ends of each of the active areas AA1 and AA2 are connected to the source line SL2. The both ends of each of the active areas AA3 and AA4 are connected to the source line SL3. The both ends of the active area AA5 are connected to the source line SL4.

As shown in FIG. 4, the MRAM according to the present embodiment is formed on a semiconductor substrate 10. The active areas AA and STIs (Shallow Trench Isolations) 20 are alternately formed in the semiconductor substrate 10. The cell transistors CT are formed in the active areas AA. As shown in FIG. 4, the cell transistors CT each include a gate electrode GC embedded in the semiconductor substrate 10 and has an $N^+$-source diffusion layer S and an $N^+$-drain diffusion layer D on both sides of the gate electrode GC, respectively. The gate electrodes GC are insulated and isolated from the semiconductor substrate 10, the bottom electrode contacts BEC, the landing pad contacts LPC, and the source line contacts SLC.

Two cell transistors CT are formed in each active area AA and these two cell transistors CT share the source S or the drain D. In this example, two cell transistors CT share the drain D.

The drain D shared by two cell transistors CT is connected to a lower electrode (a pinned layer, for example) of one MTJ element via one bottom electrode contact (one contact plug) BEC.

The source S of each of the cell transistors CT is electrically connected to one source line SL via the corresponding landing pad contact LPC and the corresponding source line contact SLC.

An upper electrode (a free layer, for example) of each of the MTJ elements is electrically connected to one bit line BL via the corresponding top electrode contact TEC. The top electrode contacts TEC are arranged on the MTJ elements and are connected between the upper electrodes of the MTJ elements and the bit lines BL, respectively. Therefore, the bit lines BL are electrically connected to the MTJ elements provided right below, respectively. For example, as shown in FIG. 4, the bit line BL2 is electrically connected to the upper electrode of the MTJ element MTJ3 arranged right below the bit line BL2 via a top electrode contact TEC3. As shown in FIG. 5, the bit line BL1 is electrically connected to the upper electrode of the MTJ element MTJ2 arranged right below the bit line BL1 via a top electrode contact TEC2.

As shown in FIG. 3, the top electrode contacts TEC arranged on the MTJ elements MTJ1 to MTJ4 are assumed as top electrode contacts TEC1 to TEC4, respectively. In this case, the bit line BL1 is provided on the top electrode contacts TEC1 and TEC2 located on the MTJ elements MTJ1 and MTJ2 arrayed in the direction D2, respectively. Accordingly, the bit line BL1 is connected to the upper electrodes of the MTJ elements MTJ1 and MTJ2 arranged right below the bit line BL1 via the top electrode contacts TEC1 and TEC2, respectively. The bit line BL2 is provided on the top electrode contacts TEC3 and TEC4 located on the MTJ elements MTJ3 and MTJ4 arrayed in the direction D2, respectively. Accordingly, the bit line BL2 is connected to the upper electrodes of the MTJ elements MTJ3 and MTJ4 arranged right below the bit line BL2 via the top electrode contacts TEC3 and TEC4, respectively. That is, each of the bit lines BL is electrically connected to a plurality of MTJ elements arranged right therebelow in common.

An interlayer dielectric film ILD is provided to insulate between wires.

As shown in FIG. 5, the landing pad contacts LPC extend in the direction D1 and each electrically connect ends of two active areas AA. For example, the landing pad contact LPC2 electrically connects the active areas AA3 and AA4.

Each of the source line contacts SLC is provided to correspond to one of the landing pad contacts LPC and electrically connects the landing pad contact LPC and one of the source lines SL corresponding thereto to each other. For example, the source line contact SLC2 shown in FIG. 5 is arranged on an end of the landing pad contact LPC2 and electrically connects the landing pad contact LPC2 and the source line SL3 to each other. The landing pad contact LPC2 thereby connects the sources S of two cell transistors CT in common and connects the sources S to the source line SL3 via the source line contact SLC2.

As shown in FIG. 3, the bit lines BL and the source lines SL are arranged alternately in the direction D1 in the planar layout. Furthermore, as shown in FIG. 5, the bit lines BL and the source lines SL are formed in different layers in a cross-sectional layout. In the present embodiment, the bit lines BL are provided in upper layers than the source lines SL.

As shown in FIGS. 4 and 5, the MTJ elements are arranged above parts of the active areas AA located between adjacent ones of the gate electrodes GC. That is, the MTJ elements are arranged above the drains D in central portions of the active areas AA and are electrically connected to the drains D of the cell transistors CT via the bottom electrode contacts BEC, respectively. For example, as shown in FIG. 4, the MTJ element MTJ3 is arranged above a part of the active area AA3 located between the second gate electrode GC2 and the third gate electrode GC3. Similarly, as can be understood with reference to FIG. 3, the MTJ element MTJ1 is arranged above a part of the active area AA1 located between the first gate electrode GC1 and the second gate electrode GC2. The MTJ element MTJ2 is arranged above a part of the active area AA2 located between the third gate electrode GC3 and the fourth gate electrode GC4. The MTJ element MTJ4 is arranged above a part of the active area AA4 located between the fourth gate electrode GC4 and the fifth gate electrode GC5.

In the planar layout of FIG. 3, the cell transistors CT are provided at intersections between the gate electrode GC and the active area AA, respectively, and two cell transistors CT are provided for each active area AA. As shown in FIG. 4, two cell transistors CT are formed in parts of the active area AA on both sides of one MTJ element and the drain D common to the two cell transistors CT is connected to the lower electrode of the MTJ element via the bottom electrode contact BEC. In this way, two cell transistors CT are provided in each of the active areas AA and the two cell transistors CT correspond to one MTJ element.

The bottom electrode contacts BEC are connected between the lower electrodes of the MTJ elements and the central portions (the drains D) of the active areas AA, respectively, as shown in FIGS. 4 and 5. The bottom electrode contacts BEC are arranged to overlap with the MTJ elements in a planar layout, respectively. For example, the bottom electrode contacts BEC arranged under the MTJ elements MTJ1 to MTJ4 are assumed as bottom electrode contacts BEC1 to BEC4 (not shown), respectively. In this case, the bottom electrode contact BEC1 is arranged on a central portion of the active area AA1 between the gate electrode GC1 and the gate electrode GC2 and connects the MTJ element MTJ1 and the active area AA1 to each other. The bottom electrode contact BEC2 is arranged on a central portion of the active area AA2 between the gate electrode GC3 and the gate electrode GC4 and connects the MTJ element MTJ2 and the active area AA2 to each other. The bottom electrode contact BEC3 is arranged on a central portion of the active area AA3 between the gate electrode GC2 and the gate electrode GC3 and connects the MTJ element MTJ3 and the active area AA3 to each other. The bottom electrode contact BEC4 is arranged on a central portion of the active area AA4 between the gate electrode GC4 and the gate electrode GC5 and connects the MTJ element MTJ4 and the active area AA4 to each other.

As shown in FIG. 3, a unit cell UC of one memory cell MC corresponds to one active area AA and the size is $12F^2$ ($6F \times 2F$). Therefore, the MRAM according to the present embodiment is sufficiently small to be used as a substitute for a DRAM.

F is a minimum processing dimension of a case where a lithography technique and an etching technique are used.

In a data writing or data reading operation, to select a certain memory cell MC, a gate electrode GC (a word line WL) corresponding to the memory cell MC is driven. A plurality of cell transistors CT connected to the word line WL are thereby brought to a conduction state. By then applying a voltage difference to a bit line BL of a certain column, a memory cell MC corresponding to an intersection between the selected word line WL and the selected bit line BL is selected and a current can be caused to flow to the MTJ element of the selected memory cell MC via the corresponding cell transistors CT.

In the present embodiment, two cell transistors CT flow a current to one MTJ element. That is, the MRAM according to the present embodiment is a 2T-1MTJ MRAM. Therefore, a parasitic resistance caused by channel resistances and diffusion layer resistances of the select transistors CT is reduced to half of that in a case where one select transistor is provided for each MTJ element. Accordingly a write current in a data writing operation can be increased. This enables to write data to the MTJ element in a short time and easily.

According to the present embodiment, the bit lines BL are connected directly to the top electrode contacts TEC, respectively. That is, no other connection wires (top electrode wires) are provided between the bit lines BL and the top electrode contacts TEC, respectively. Furthermore, the top electrode contacts TEC are connected to the entire surfaces of the upper electrodes of the MTJ elements, respectively. Therefore, a parasitic resistance between the bit lines BL and the top electrode contacts TEC (the upper electrodes of the MTJ elements) becomes small.

According to the present embodiment, one MTJ element is provided with respect to each of the active areas AA. Therefore, in the present embodiment, the arrangement density of the MTJ elements is reduced to half of that in a case where two MTJ elements are provided with respect to each of the active areas AA. In this case, the interval between the MTJ elements is also increased. For example, at the time of processing, the MTJ elements are etched by an IBE (Ion Beam Etching) method in an oblique direction. Accordingly, if the interval between the MTJ elements is narrow, one of adjacent MTJ elements shadows the other MTJ element and blocks ion beams (shadowing). In this case, the MTJ elements cannot be processed in a desired shape. On the other hand, according to the present embodiment, because the interval between the MTJ elements is relatively wide, the shadowing mentioned above is suppressed. Therefore, the MTJ elements can be easily processed in a desired shape. As a result, characteristics of the MTJ elements are improved and the yield of the MRAM can be enhanced.

According to the present embodiment, the bit lines BL and the source lines SL do not overlap with each other and are deviated from each other by a half pitch in a planar layout. That is, in the planar layout, the bit lines BL and the source lines SL are alternately arranged. This causes the interval between the bit lines BL and the source lines SL to be relatively wide and thus reduces a parasitic capacitance between the bit lines BL and the source lines SL. As a result, a noise (a proximity effect) during a high-speed operation is suppressed and power consumption can be also suppressed.

Figure 6:
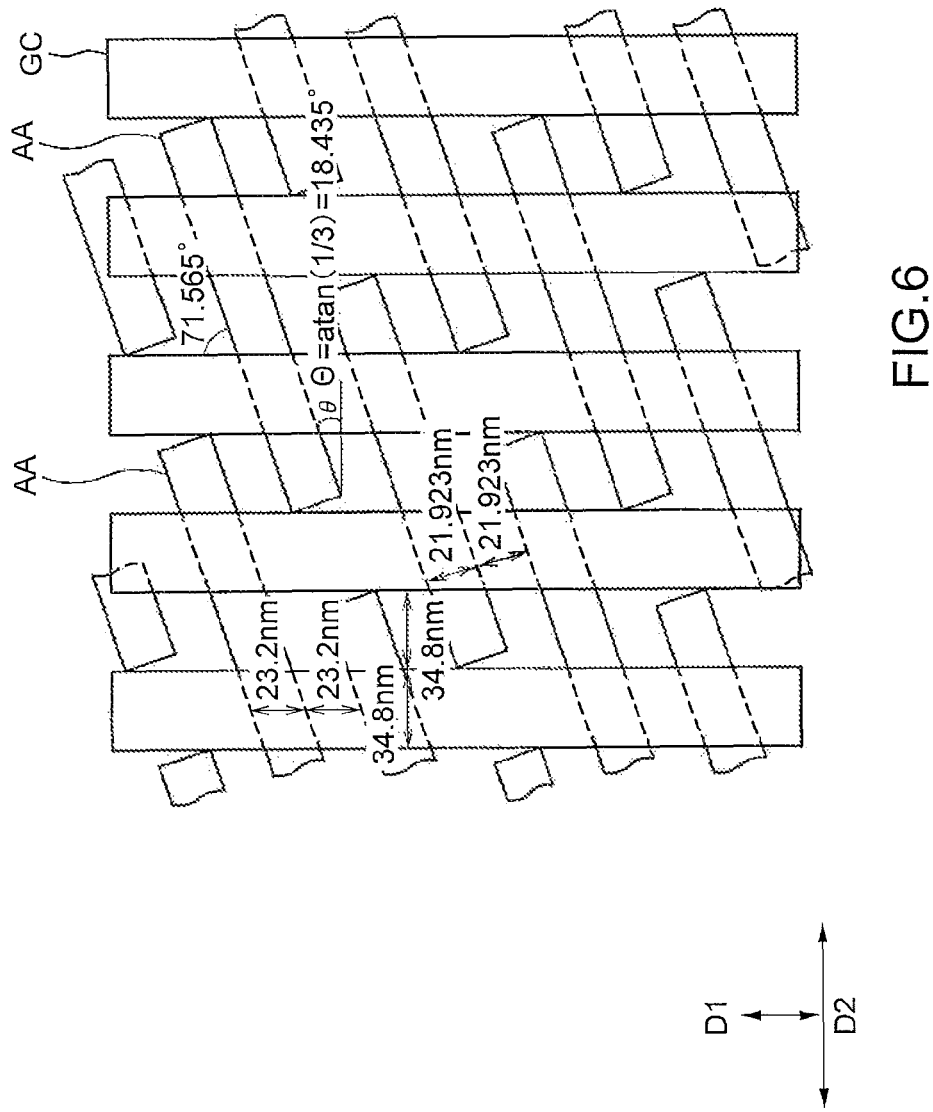
FIG. 6 is a plan view showing the active areas AA and the gate electrodes GC.

FIG. 6 is a plan view showing the active areas AA and the gate electrodes GC (the word lines WL). The active areas AA according to the present embodiment extend in a direction intersecting with the gate electrodes GC at an angle of (90−a tan(⅓)). That is, the active areas AA are tilted with respect to the direction D1 at an angle of about 71.565 degrees. The active areas AA are tilted with respect to the direction D2 at an angle of about 18.435 degrees.

In the present embodiment, the width of the gate electrodes GC (the word lines WL) or the interval between adjacent ones of the gate electrodes GC (the word lines WL) in the direction D2 is 3/2 times as large as the width of the active areas AA or, the interval between adjacent ones of the active areas AA in the direction D1.

For example, the width of the gate electrodes GC or the interval between two adjacent gate electrodes GC in the direction D2 is about 34.8 nanometers. The width of the active areas AA or the interval between adjacent ones of the active areas AA is about 21.923 nanometers. The active areas AA are tilted with respect to the direction D2 at an angle of a tan(⅓) degrees (about 18.435 degrees). Therefore, the width of the active areas AA or the interval between adjacent ones of the active areas AA in the direction D1 is about 23.2 nanometers. Accordingly, in this case, the width of the gate electrodes GC or the interval between adjacent ones of the gate electrodes GC in the direction D2 is 3/2 times as large as the width of the active areas AA or the interval between adjacent ones of the active areas AA in the direction D1.

Because the pitch of the bit lines BL is 1.5 times as large as that of the active areas AA, the ratio between the pitch of the bit lines BL (columns) and the pitch of the word lines WL (rows) is 1:1. Meanwhile, the ratio between the line-and-space of the active areas AA and the line-and-space of the gate electrodes GC (the word lines WL) is 2:3.

When the active areas AA are tilted with respect to the direction D1 at an angle of (90−a tan(⅓)) degrees and the ratio in the pitches between the active areas AA and the gate electrodes GC (the word lines WL) is set to 2:3 in this way, the MTJ elements can be arranged at an equal interval (an equal pitch) in the direction D2 and the direction D1 as shown in FIG. 3. In the specific example mentioned above, the interval between adjacent ones of the MTJ elements in the direction D2 or the direction D1 is about 69.6 nanometers.

The layout example of FIG. 6 is merely illustrative and the dimensions and the angles are not limited to those in the example.

When the MTJ elements are arranged at an equal interval in the direction D2 and the direction D1 in a planar layout as mentioned above, variations in the shape and the size (process variations) of the MTJ elements can be suppressed at a manufacturing step of the MRAM. Furthermore, when the MTJ elements are arranged at an equal interval in the direction D2 and the direction D1, the MTJ elements can be easily processed using the lithography technique and the etching technique even when the interval between the MTJ elements is narrow.

A manufacturing method of the MRAM according to the present embodiment is explained next.

FIGS. 7 to 18B are plan views and cross-sectional views showing an example of the manufacturing method of the MRAM according to the first embodiment. FIGS. 7, 9, 11, 13, 15, and 17 show planar layouts of structures at manufacturing steps. FIGS. 8A, 10A, 12A, 14A, 16A, and 18A are cross-sectional views along a line A-A in FIGS. 7, 9, 11, 13, 15, and 17, respectively. FIGS. 8B, 10B, 12B, 14B, 16B, and 18B are cross-sectional views along a line B-B in FIGS. 7, 9, 11, 13, 15, and 17, respectively.

Figure 7:
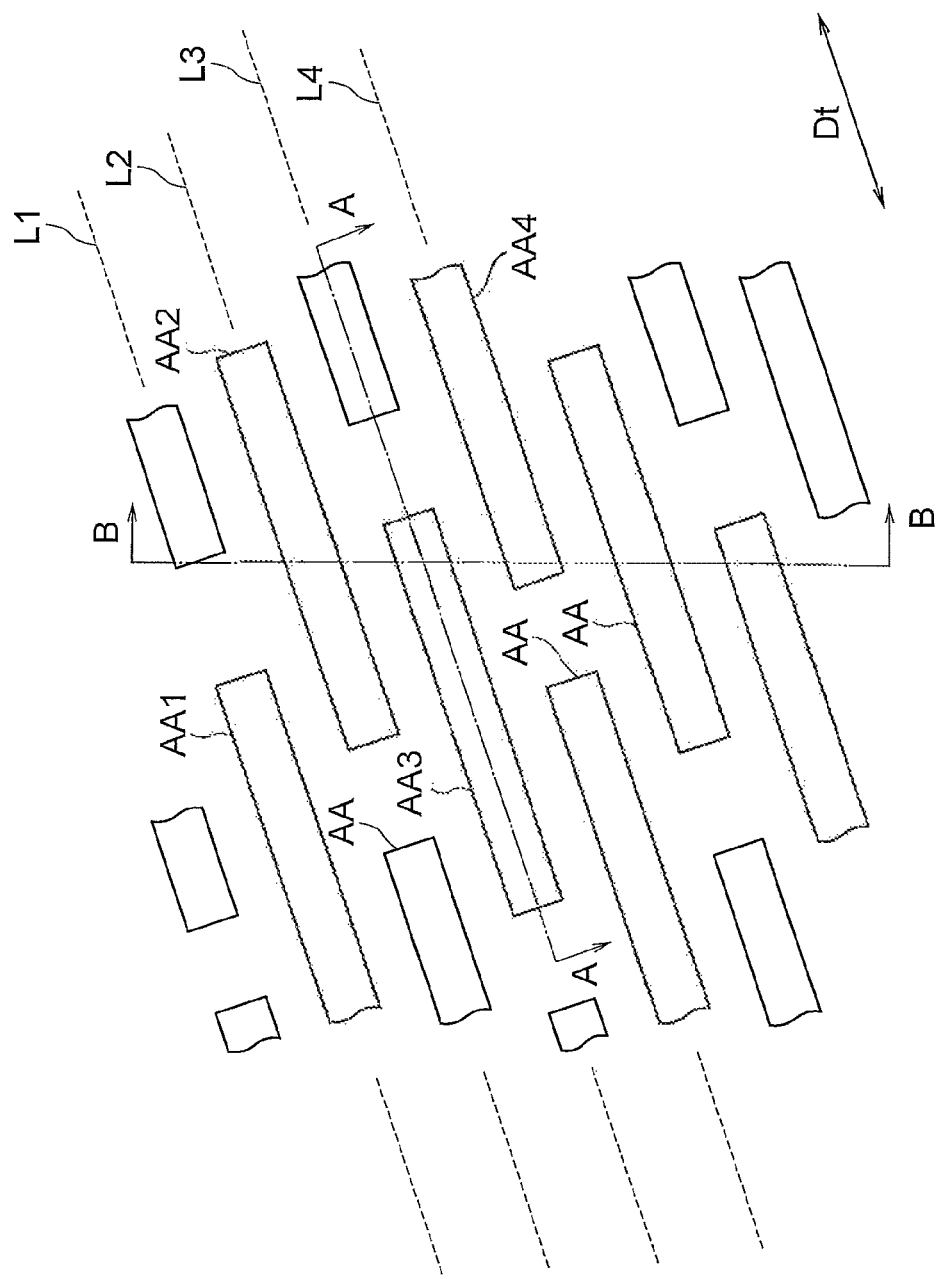
FIGS. 7 to 18B are plan views and cross-sectional views showing an example of the manufacturing method of the MRAM according to the first embodiment.
Figure 8A:
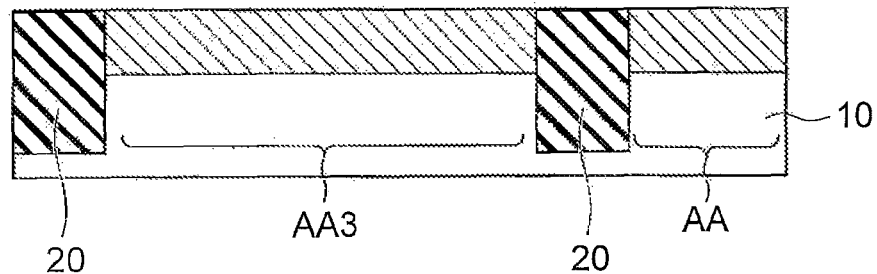
Figure 8B:
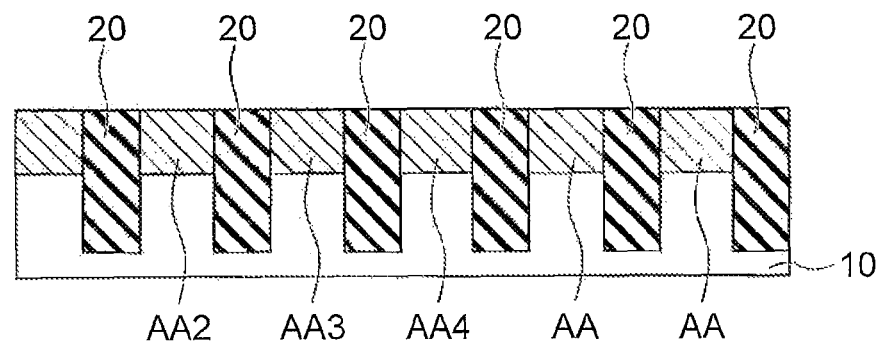

Trenches are first formed on a surface of the semiconductor substrate 10 using the lithography technique and the etching technique to form shallow trench isolations on the surface of the semiconductor substrate 10. The STIs 20 are then formed by embedding a silicon dioxide film in the trenches. Structures shown in FIGS. 7, 8A and 8B are thereby obtained. The width of the STIs 20 is, for example, about 22 nanometers. The depth of the STIs 20 is, for example, about 200 nanometers.

When the STIs 20 are formed, the active areas AA are defined. The active areas AA extend in the tilt direction Dt as shown in FIG. 7. For example, the active areas AA1 to AA4 are on the first to fourth lines L1 to L4 extending in the tilt direction Dt, respectively. The first to fourth lines L1 to L4 are imaginary lines adjoining each other in the order from the first to fourth ones.

Figure 9:
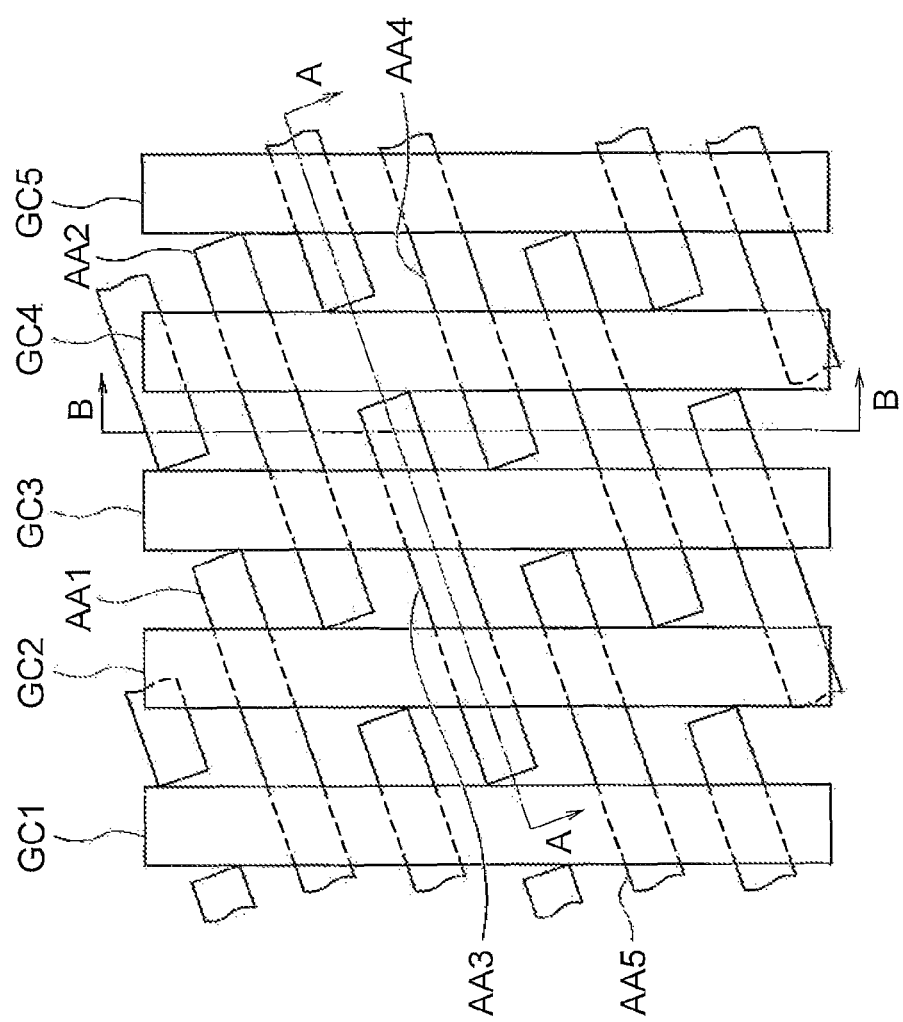
Figure 10A:
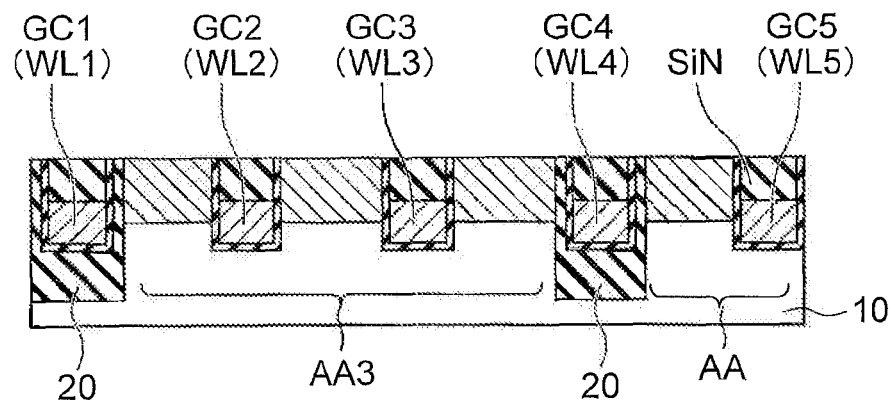
Figure 10B:
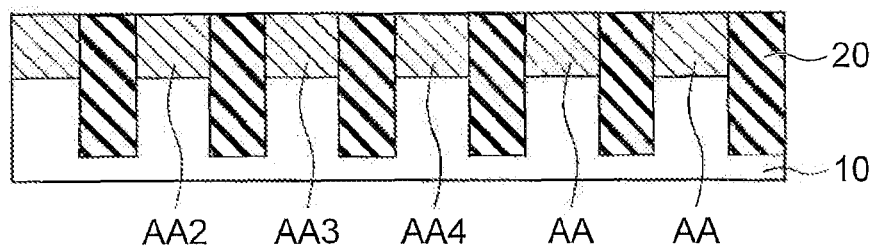

Gate trenches are then formed in the active areas AA and in the STIs 20 using the lithography technique and the etching technique to form the gate electrodes GC1 to GC4. A gate dielectric film (a silicon dioxide film, for example) is formed on inner surfaces of the gate trenches and then polysilicon is filled in the gate trenches. The polysilicon is then etched back until an upper surface of the polysilicon becomes lower than opening portions of the gate trenches. Tungsten and a silicon nitride film are then embedded in the gate trenches. Embedded gate electrodes GC1 to GC5 (the word lines WL1 to WL5) are thereby formed as shown in FIGS. 9, 10A, and 10B. The gate electrodes GC1 to GC5 are surrounded by the gate dielectric film and the silicon nitride film in a vertical cross section to the direction D1 and are electrically insulated and isolated from the semiconductor substrate 10.

Figure 11:
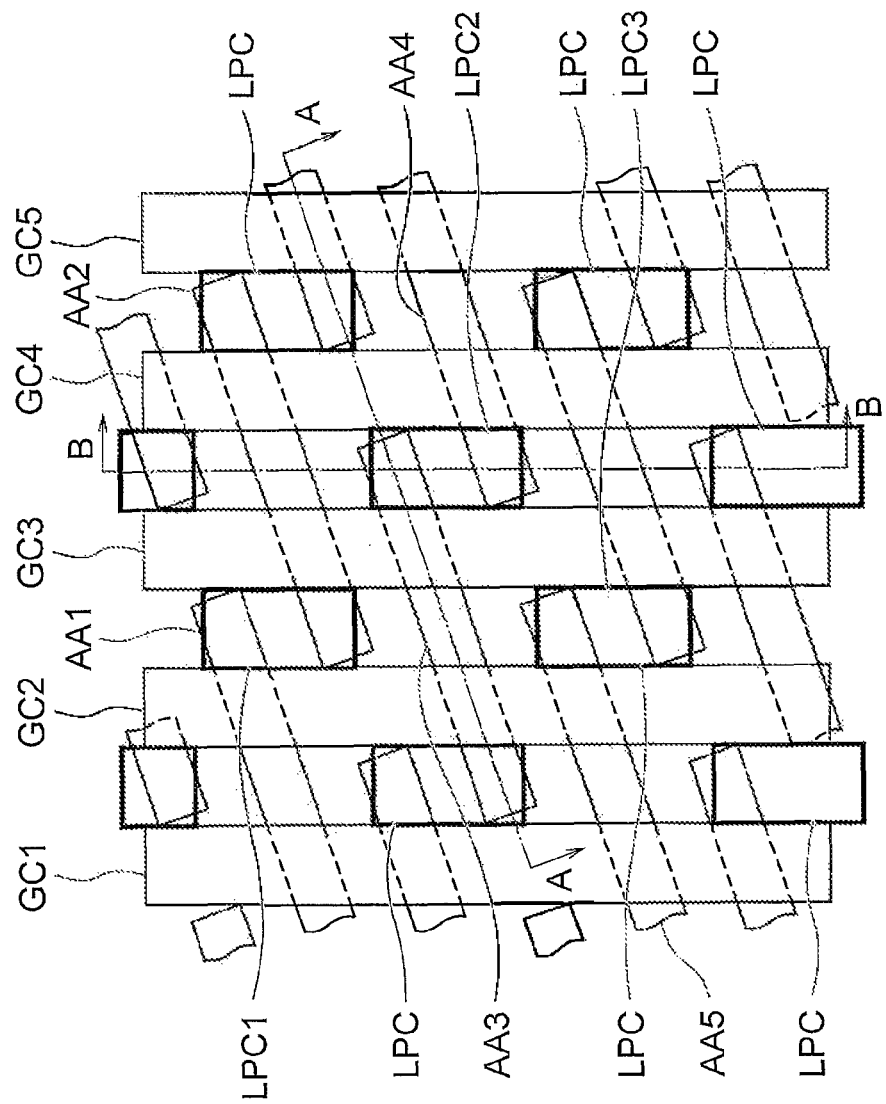
Figure 12A:
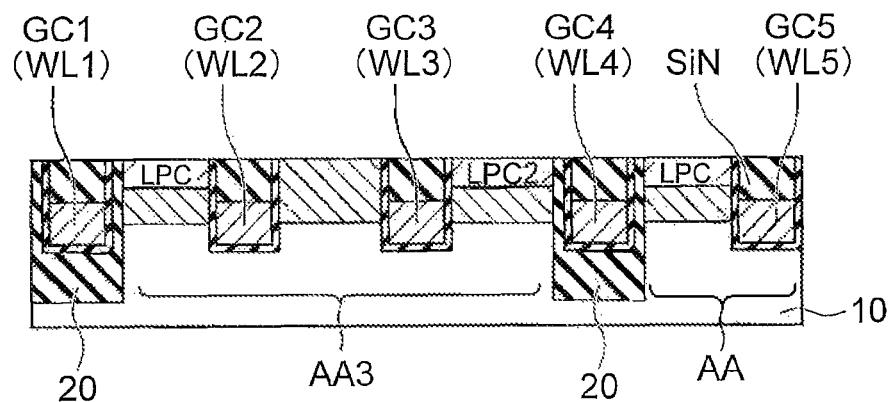
Figure 12B:
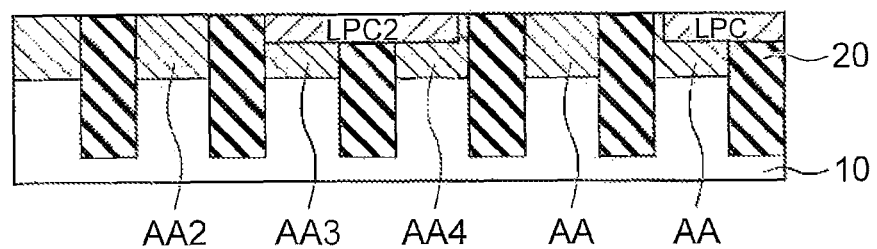

Parts of the active areas AA and the STIs 20 between adjacent ones of the gate electrodes GC, in which no MTJ elements or no bottom electrode contacts BEC are formed are then etched using the lithography technique and the etching technique. An etching depth is, for example, about 10 nanometers. A material of the landing pad contacts LPC is then deposited and is polished using a CMP (Chemical Mechanical Polishing) method until the surface of the active areas AA is exposed. The landing pad contacts LPC are thereby formed as shown in FIGS. 11, 12A, and 12B. The material of the landing pad contacts LPC is a conductor such as TiN or Ti. The landing pad contacts LPC are provided to connect ends of active areas AA adjoining in the direction D2 between adjacent ones of the gate electrodes GC. For example, as shown in FIGS. 11 and 12B, the landing pad contact LPC2 is arranged on an end of the active area AA3 and an end of the active area AA4. Accordingly, the landing pad contact LPC2 electrically connects the source S of one cell transistor CT formed in the active area AA3 and the source S of one cell transistor CT formed in the active area AA4.

Figure 13:
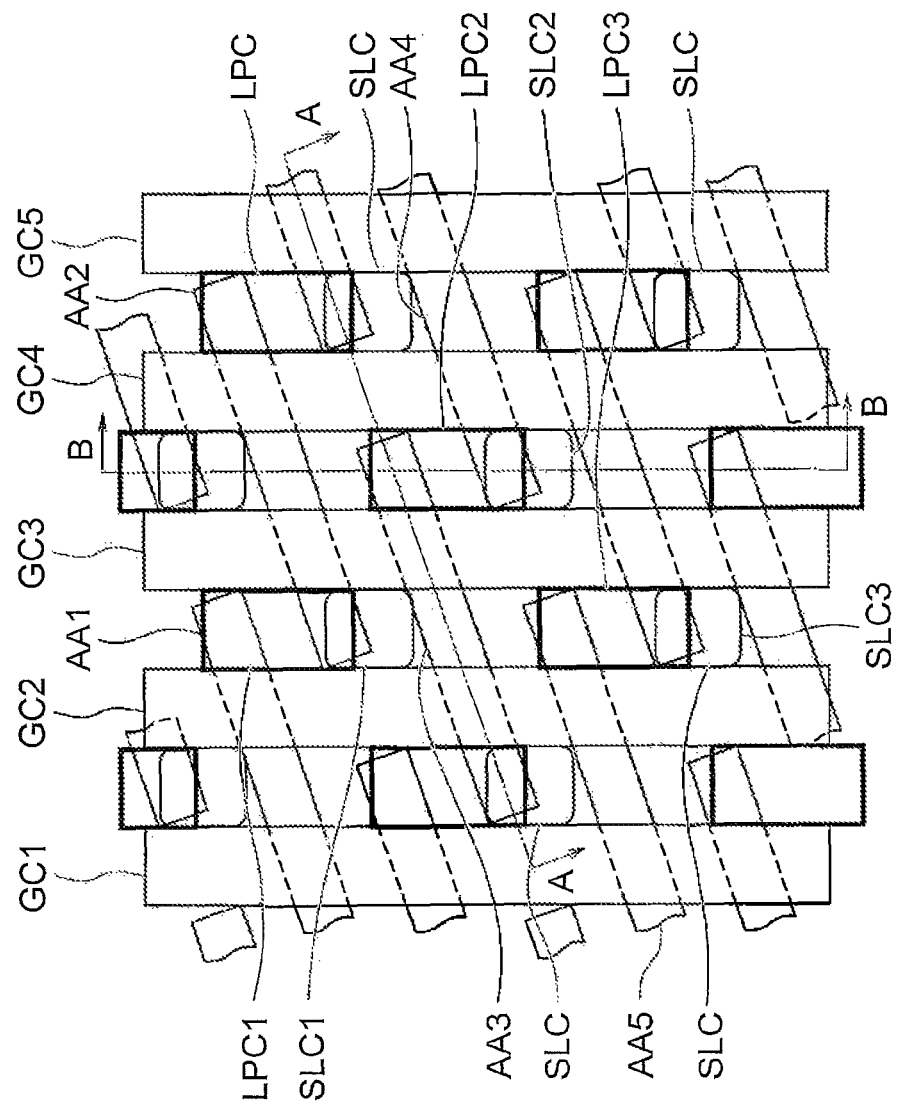
Figure 14A:
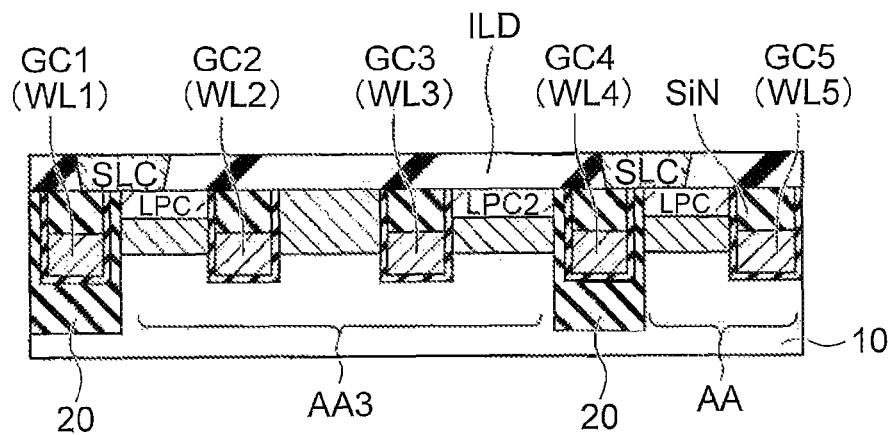
Figure 14B:
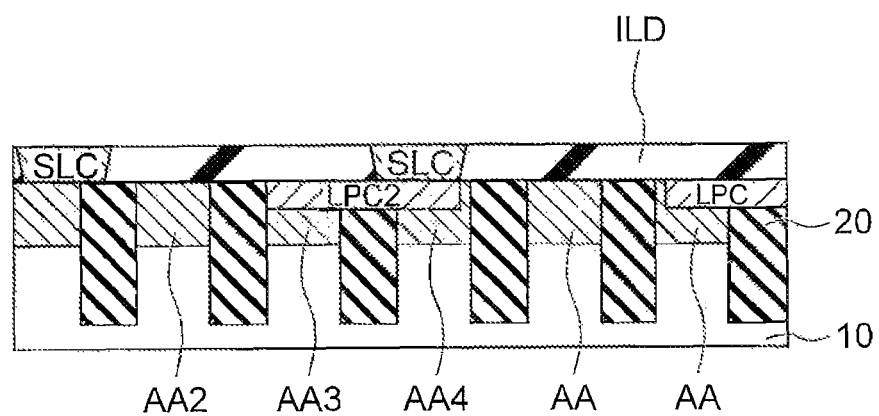

After an interlayer dielectric film ILD (a silicon dioxide film, for example) is then deposited, parts of the interlayer dielectric film ILD located between adjacent ones of the gate electrodes GC are selectively removed using the lithography technique and the etching technique to expose ends of the landing pad contacts LPC. A material of the source line contacts SLC is then deposited and the material of the source line contacts SLC is etched back until the interlayer dielectric film ILD is exposed. The material of the source line contacts SLC is a conductive metal such as tungsten. The source line contacts SLC electrically connected to the landing pad contacts LPC are thereby formed as shown in FIGS. 13, 14A, and 14B.

Figure 15:
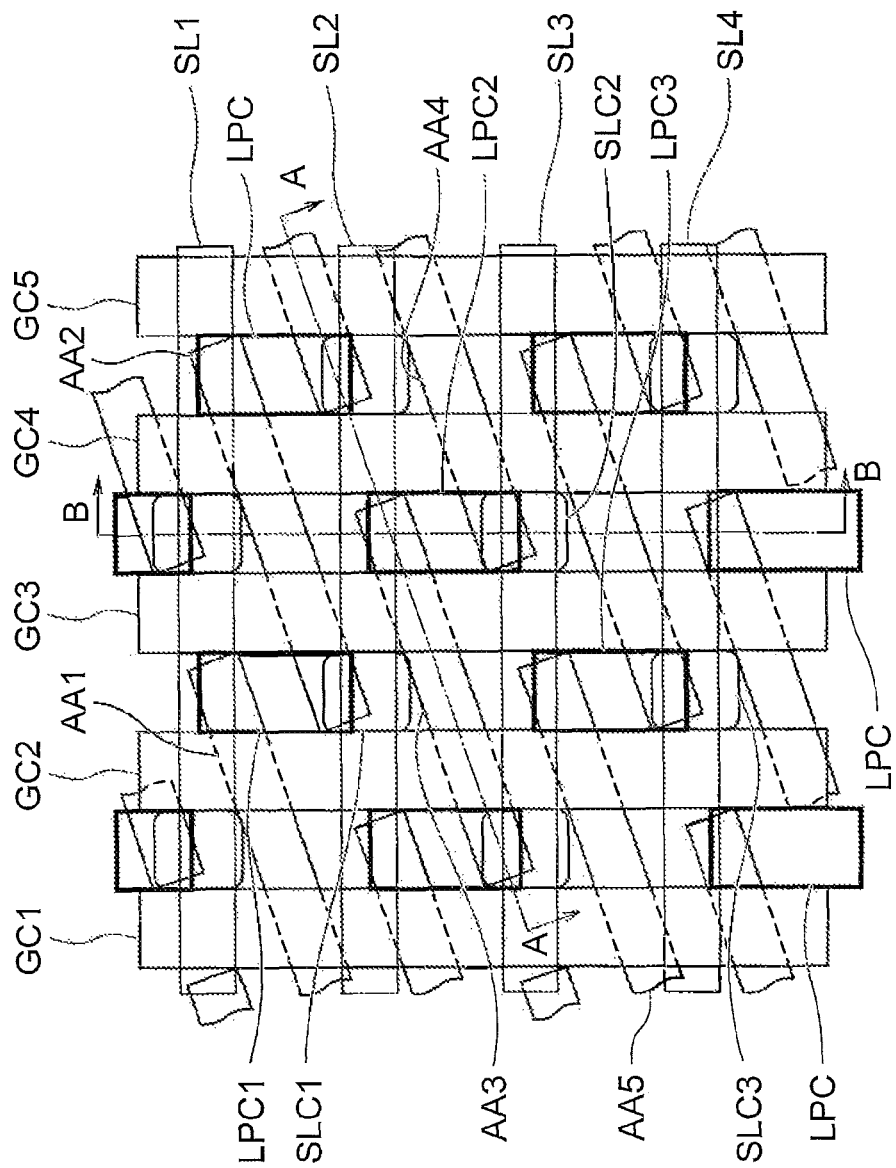
Figure 16A:
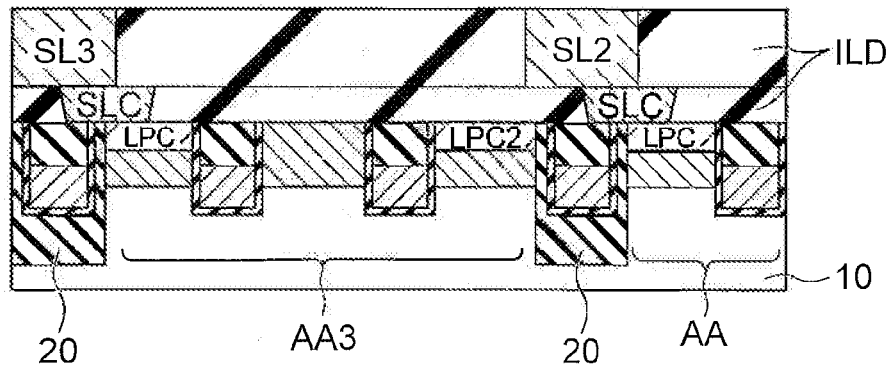
Figure 16B:
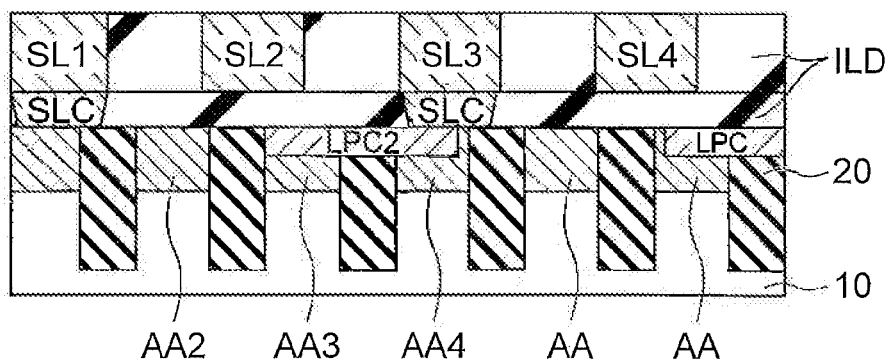

A material of the source lines SL is then deposited. The material of the source lines SL is a conductive metal such as tungsten. The material of the source lines SL is then processed in a pattern of the source lines SL using the lithography technique and the etching technique. The source lines SL1 to SL4 are thereby formed as shown in FIG. 15. After an interlayer dielectric film ILD (a silicon dioxide film, for example) is then deposited, the interlayer dielectric film ILD is polished using the CMP method until the source lines SL are exposed. The interlayer dielectric film ILD is thereby formed between adjacent ones of the source lines SL1 to SL4 as shown in FIGS. 15, 16A, and 16B.

After an interlayer dielectric film ILD (a silicon dioxide film, for example) is then deposited, parts of the active areas AA between adjacent ones of the gate electrodes GC, in which the MTJ elements and the bottom electrode contacts BEC are to be formed are etched using the lithography technique and the etching technique. That is, contact holes are formed in parts of the active areas AA between adjacent ones of the gate electrodes GC, in which the landing pad contacts LPC are not formed (in the central portions of the active areas AA). A material of the bottom electrode contacts BEC is then deposited and the material of the bottom electrode contacts BEC is polished using the CMP method. The bottom electrode contacts BEC are thereby formed on the central portions of the active areas AA, respectively. Because the drains D of the cell transistors CT are formed in the central portions of the active areas AA, the bottom electrode contacts BEC are connected to the drains D of the cell transistors CT, respectively.

Figure 17:
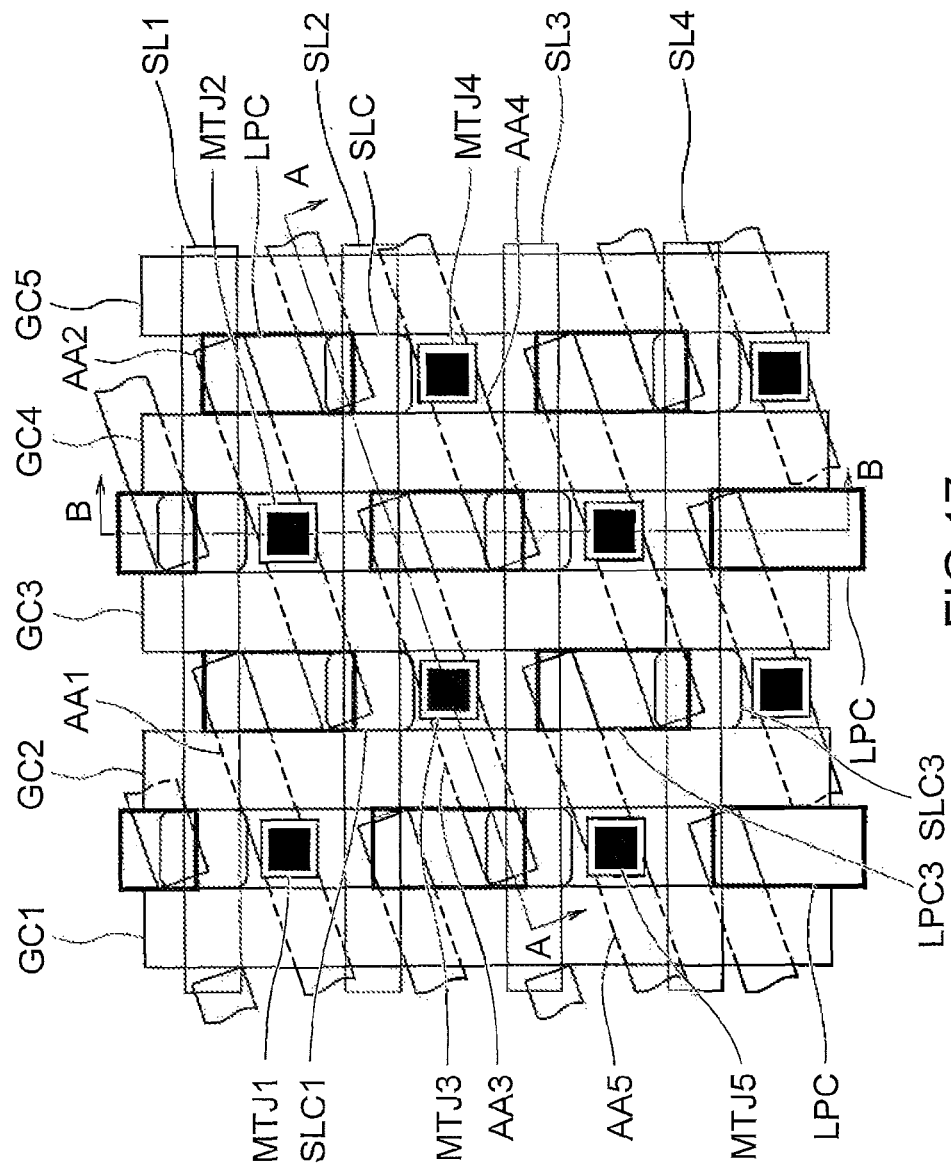
Figure 18A:
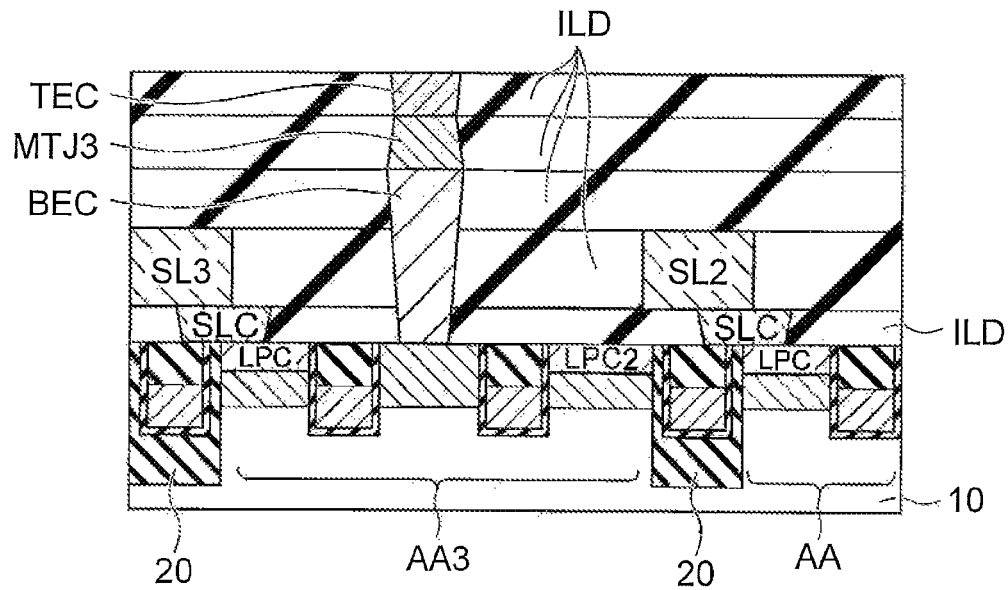
Figure 18B:
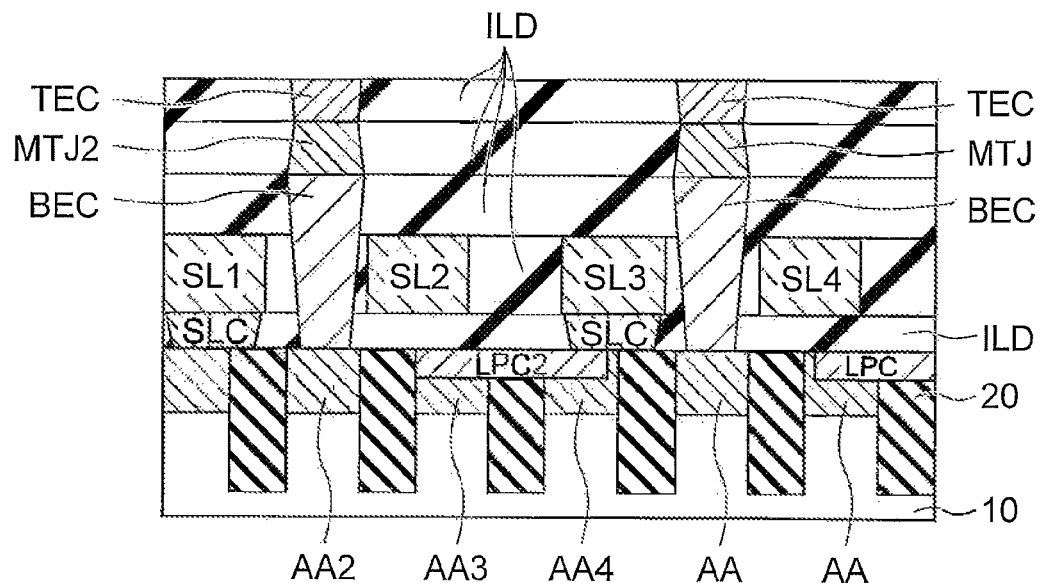

A material of the MTJ elements is then stacked on the bottom electrode contacts BEC and the interlayer dielectric film ILD. The material of the MTJ elements is then processed using the lithography technique and the etching technique (the IBE method, for example). The MTJ elements are thereby formed on the bottom electrode contacts BEC, respectively, as shown in FIGS. 17, 18A, and 18B. The MTJ elements are provided to correspond to the active areas AA and are arranged in the central portions of the active areas AA in a planar layout, respectively. Because not two MTJ elements but one MTJ element is formed for each of the active areas AA in this example, the problem of shadowing mentioned above is unlikely to occur.

After an interlayer dielectric film ILD (a silicon dioxide film, for example) is then deposited, parts of the interlayer dielectric film ILD on the MTJ elements are removed using the lithography technique and the etching technique. A material of the top electrode contacts TEC is then deposited. The material of the top electrode contacts TEC is a conductive metal such as tungsten. The material of the top electrode contacts TEC is then polished using the CMP method until the interlayer dielectric film ILD is exposed. The top electrode contacts TEC are thereby formed on the MTJ elements, respectively, as shown in FIGS. 18A and 18B.

The bit lines BL extending in the direction D2 are then formed on the top electrode contacts TEC. A material of the bit lines BL is a conductive metal such as tungsten. The bit lines BL are electrically connected to the upper electrodes of the MTJ elements arrayed in the direction D2 via the top electrode contacts TEC, respectively.

An interlayer dielectric film, contact plus, wires, and the like are then further formed, whereby the MRAM shown in FIGS. 3 to 5 is completed.

According to the present embodiment, one MTJ element is provided for each of the active areas AA. Therefore, the present embodiment reduces the arrangement density of the MTJ elements to half of that in the case where two MTJ elements are provided for each of the active areas AA. Accordingly, the interval between the MTJ elements is relatively wide and thus the problem of shadowing is suppressed at the time of processing the MTJ elements. Therefore, the MTJ elements can be easily processed in a desired shape. As a result, the characteristics of the MTJ elements can be improved and the yield of the MRAM can be enhanced.

Second Embodiment

Figure 19:
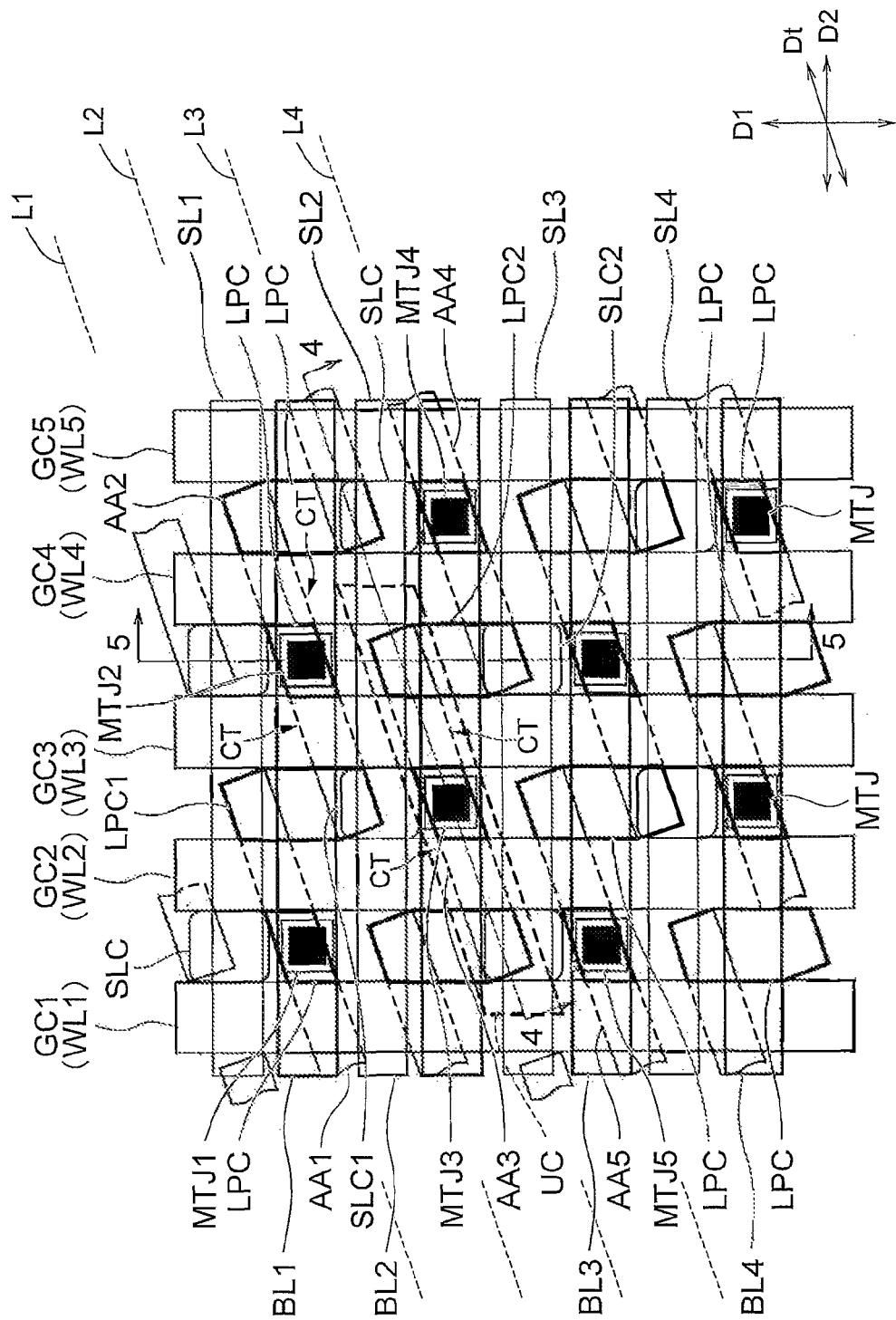
FIG. 19 is a planar layout showing an example of a configuration of an MRAM according to a second embodiment.
Figure 20:
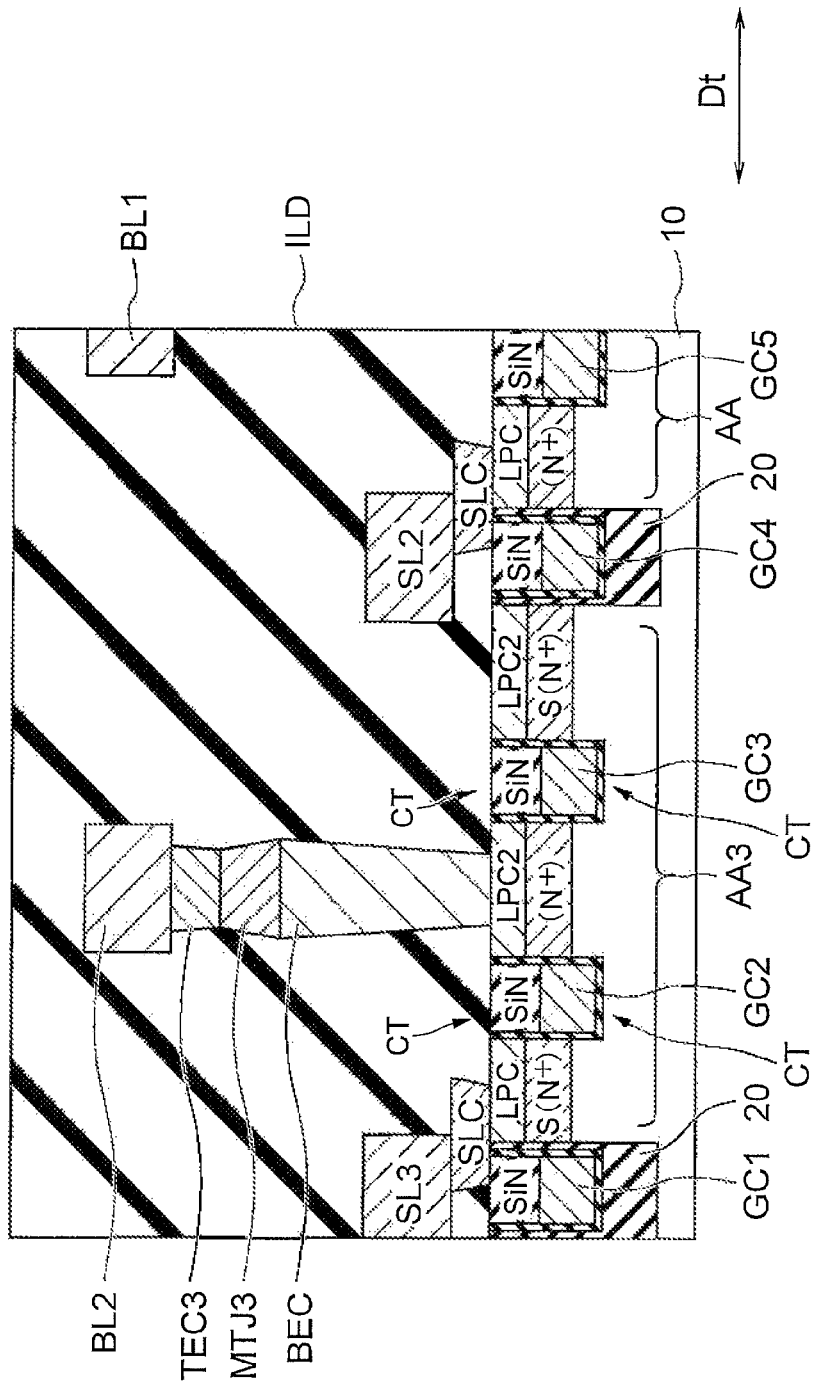
FIG. 20 is a cross-sectional view along a line 4-4 (active areas AA) in FIG. 19.
Figure 21:
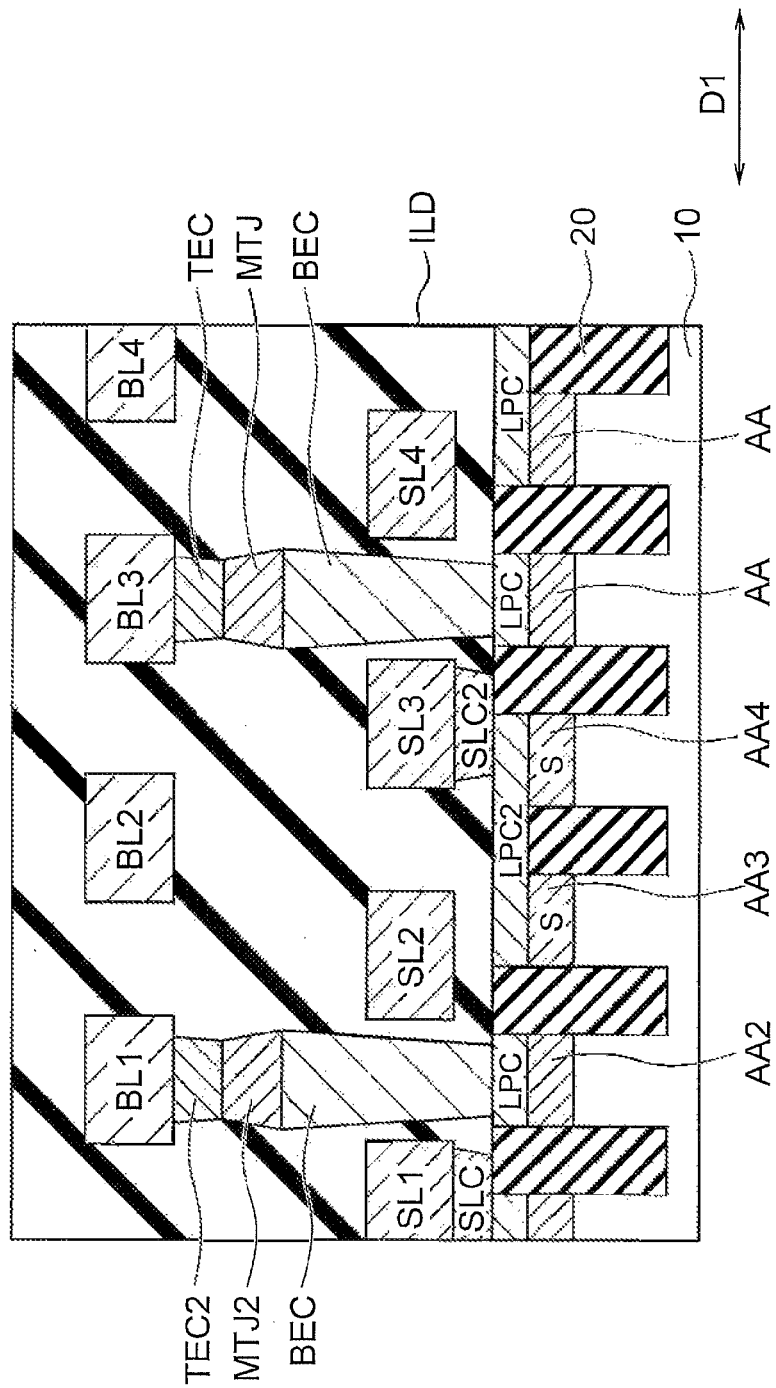
FIG. 21 is a cross-sectional view along a line 5-5 (gate electrodes GC) in FIG. 19.

FIG. 19 is a planar layout showing an example of a configuration of an MRAM according to a second embodiment. FIG. 20 is a cross-sectional view along a line 4-4 (active areas AA) in FIG. 19. FIG. 21 is a cross-sectional view along a line 5-5 (gate electrodes GC) in FIG. 19. The second embodiment is different from the first embodiment in that the landing pad contacts LPC are provided not only on the ends of the active areas AA but also under the bottom electrode contacts BEC in the central portions of the active areas AA. For example, the landing pad contact LPC3 is arranged in the central portion of the active area AA1 between the word line WL1 and the word line WL2. A landing pad contact LPC4 is arranged in the central portion of the active area AA2 between the word line WL3 and the word line WL4. A landing pad contact LPC5 is arranged in the central portion of the active area AA3 between the word line WL2 and the word line WL3. A landing pad contact LPC6 is arranged in the central portion of the active area AA4 between the word line WL4 and the word line WL5. That is, in the second embodiment, the landing pad contacts LPC are provided also under the bottom electrode contacts BEC, respectively. Other configurations of the second embodiment can be identical to the corresponding ones of the first embodiment. Accordingly, the second embodiment can also achieve effects identical to those of the first embodiment.

When the landing pad contacts LPC are provided also under the bottom electrode contacts BEC in this way, a contact resistance between the lower electrodes of the MTJ elements and the drains D of the cell transistors CT is further reduced. Accordingly, the second embodiment can further increase the write current in a data writing operation.

The landing pad contacts LPC are made of a conductive metal such as tungsten having a relatively high etching resistance. Therefore, the landing pad contacts LPC can function as an etching stopper while contact holes for the bottom electrode contacts BEC are formed. This prevents the semiconductor substrate 10 from being scraped even when overetching is performed during formation of the contact holes for the bottom electrode contacts BEC. As a result, an increase in a conjunction leakage current can be suppressed and the yield of the MRAM can be enhanced.

A manufacturing method of the MRAM according to the second embodiment is explained next.

Figure 22:
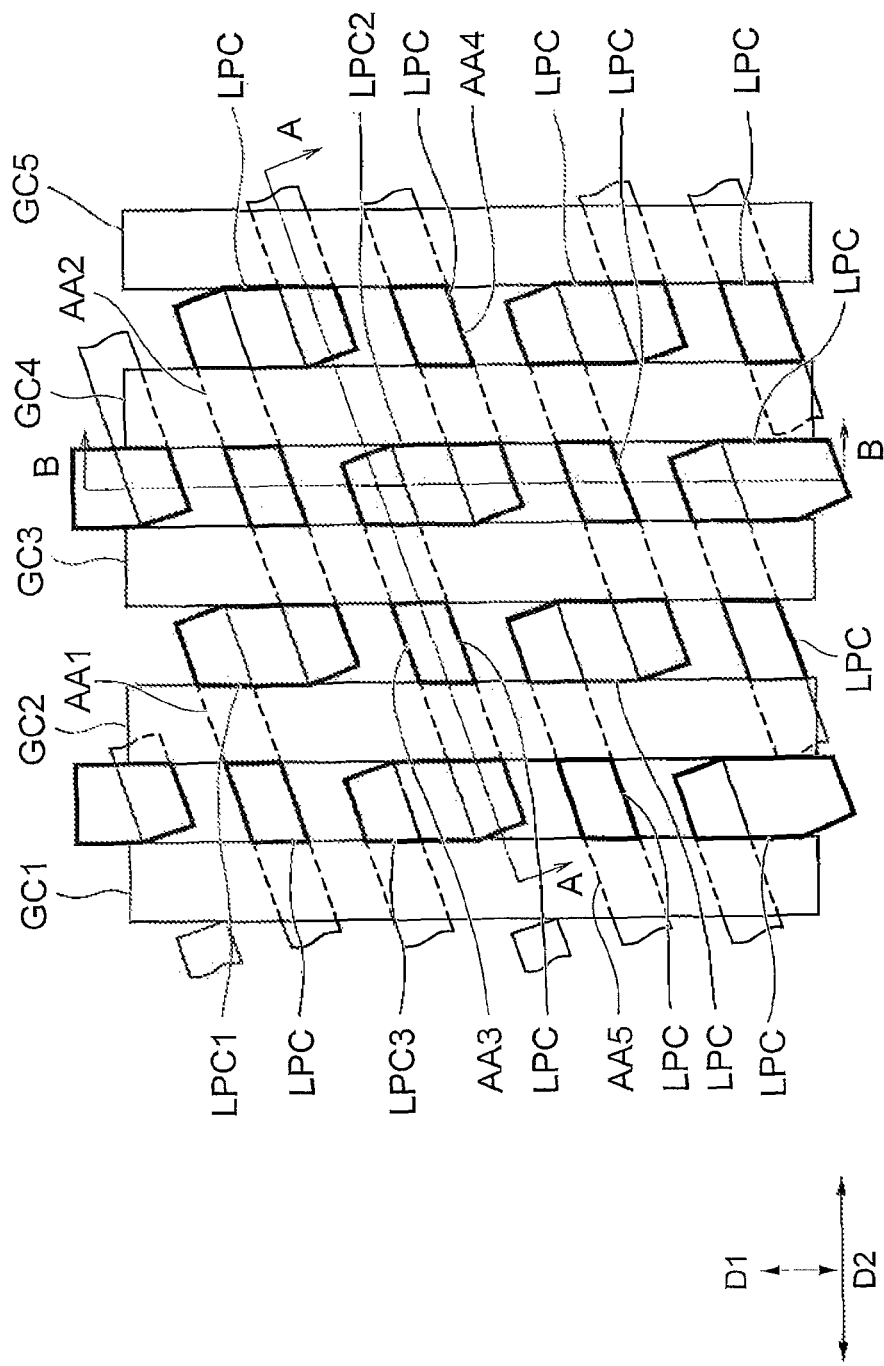
FIG. 22 is a plan view showing an example of the manufacturing method of the MRAM according to the second embodiment.
Figure 23A:
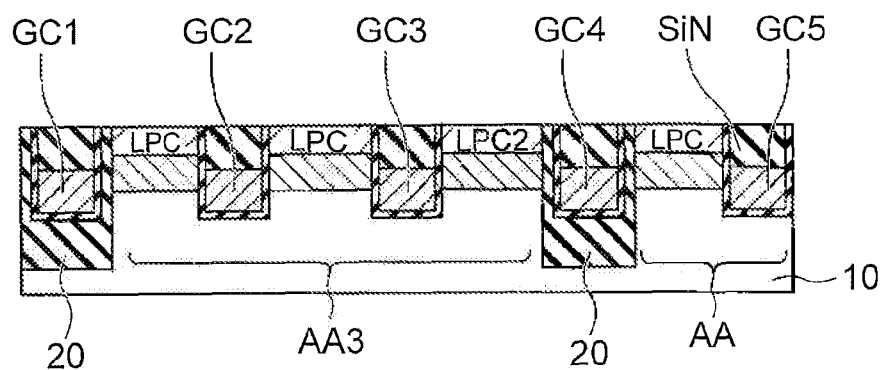
FIG. 23A is a cross-sectional view along a line A-A in FIG. 22.
Figure 23B:
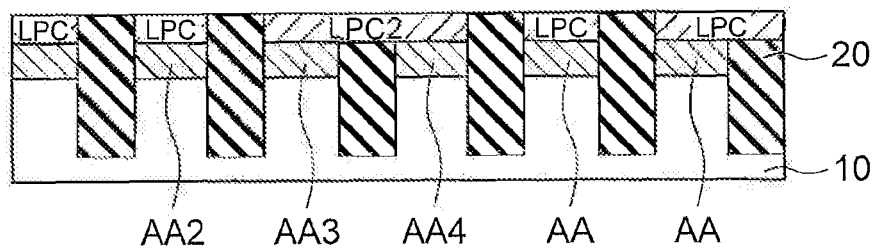
FIG. 23B is a cross-sectional view along a line B-B in FIG. 22.

FIG. 22 is a plan view showing an example of the manufacturing method of the MRAM according to the second embodiment. FIG. 23A is a cross-sectional view along a line A-A in FIG. 22. FIG. 23B is a cross-sectional view along a line B-B in FIG. 22.

After the steps explained with reference to FIGS. 7 to 10B are first performed, the landing pad contacts LPC are formed as shown in FIG. 21. While a formation method of the landing pad contacts LPC is similar to that in the first embodiment, a planar layout (a mask layout) in the second embodiment is different from that in the first embodiment. More specifically, in the first embodiment, the landing pad contacts LPC are formed only in regions of the active areas AA and the STIs 20 located between adjacent ones of the gate electrodes GC other than regions where the MTJ elements and the bottom electrode contacts BEC are formed. On the other hand, in the second embodiment, the landing pad contacts LPC are formed also in regions of the active areas AA and the SITs 20 located between adjacent ones of the gate electrodes GC where the MTJ elements and the bottom electrode contacts BEC are formed. That is, the landing pad contacts LPC are formed not only on the ends of the active areas AA between adjacent ones of the gate electrodes GC but also in the central portions of the active areas AA. Accordingly, structures shown in FIGS. 22, 23A, and 23B are thereby obtained.

The steps explained with reference to FIGS. 13 to 18B are then performed, whereby the MRAM shown in FIGS. 19 to 21 is completed.

The landing pad contacts LPC are made of a conductive metal such as tungsten. Therefore, while the contact holes for the bottom electrode contacts BEC are formed, the landing pad contacts LPC can function as an etching stopper. This suppresses an increase in the conjunction leakage current and enables to enhance the yield of the MRAM. The second embodiment can further achieve effects identical to those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   first to fifth word lines extending in a first direction and adjoining in an order from the first to fifth word lines;
   first to fourth element regions extending in a tilt direction tilted with respect to the first direction, the first to fourth element regions being on first to fourth lines adjoining in an order from the first to fourth lines, respectively, and isolated from each other by element isolation regions, the first element region intersecting with at least the first and second word lines, the second element region intersecting with at least the third and fourth word lines, the third element region intersecting with at least the second and third word lines, and the fourth element region intersecting with at least the fourth and fifth word lines;
   a first connection portion being between the second word line and the third word line, and on an end of the first element region and an end of the second element region;
   a second connection portion being between the third word line and the fourth word line, and on an end of the third element region and an end of the fourth element region;
   a first MTJ element being between the first word line and the second word line, and above the first element region;
   a second MTJ element being between the third word line and the fourth word line, and above the second element region;
   a third MTJ element being between the second word line and the third word line, and above the third element region; and
   a fourth MTJ element above the fourth element region between the fourth word line and the fifth word line, wherein
   the first MTJ element and the second MTJ element are on a substantially same line along a second direction orthogonal to the first direction, and
   the third MTJ element and the fourth MTJ element are on a substantially same line along the second direction.

2. The device of claim 1, further comprising:
   a first source line contact on an end of the first connection portion between the second word line and the third word line;
   a second source line contact on an end of the second connection portion between the third word line and the fourth word line;
   a first source line extending in the second direction and connected to the first source line contact; and
   a second source line extending in the second direction and connected to the second source line contact.

3. The device of claim 1, further comprising:
   a first bit line extending in the second direction and located above the first MTJ element and the second MTJ element; and
   a second bit line extending in the second direction and located above the third MTJ element and the fourth MTJ element.

4. The device of claim 2, further comprising:
   a first bit line extending in the second direction and located above the first MTJ element and the second MTJ element; and
   a second bit line extending in the second direction and located above the third MTJ element and the fourth MTJ element.

5. The device of claim 3, further comprising first to fourth top electrode contacts on the first to fourth MTJ elements, respectively, wherein
   the first bit line is located on the first and second top electrode contacts, and
   the second bit line is located on the third and fourth top electrode contacts.

6. The device of claim 4, further comprising first to fourth top electrode contacts on the first to fourth MTJ elements, respectively, wherein
   the first bit line is located on the first and second top electrode contacts, and
   the second bit line is located on the third and fourth top electrode contacts.

7. The device of claim 1, further comprising:
   a fifth element region being on the fourth line, the fifth element region being isolated from the first to fourth element regions by the element isolation regions, and intersecting with at least the first and second word lines; and
   a fifth MTJ element above the fifth element region between the first word line and the second word line, wherein
   a distance between the first MTJ element and the second MTJ element is substantially equal to a distance between the first MTJ element and the fifth MTJ element.

8. The device of claim 1, wherein the second and third word lines are located between the first MTJ element and the second MTJ element and the third and fourth word lines are located between the third MTJ element and the fourth MTJ element in a planar layout.

9. The device of claim 1, wherein the first to fourth MTJ elements are provided to correspond to intersections between two word lines and one bit line, respectively.

10. The device of claim 1, comprising:
    a first contact plug located on the first element region between the first word line and the second word line and provided between the first element region and the first MTJ element;

a second contact plug located on the second element region between the third word line and the fourth word line and provided between the second element region and the second MTJ element;

a third contact plug located on the third element region between the second word line and the third word line and provided between the third element region and the third MTJ element; and a fourth contact plug located on the fourth element region between the fourth word line and the fifth word line and provided between the fourth element region and fourth MTJ element, wherein the first contact plug and the second contact plug are on a substantially same line along the second direction, and the third contact plug and the fourth contact plug are on a substantially same line along the second direction.

11. The device of claim 1, wherein the first direction and the tilt direction form an angle of (90−a tan(⅓)) degrees.

12. The device of claim 1, further comprising:
a third connection portion in a central portion of the first element region between the first word line and the second word line;
a fourth connection portion in a central portion of the second element region between the third word line and the fourth word line;
a fifth connection portion in a central portion of the third element region between the second word line and the third word line; and
a sixth connection portion in a central portion of the fourth element region between the fourth word line and the fifth word line.

13. A semiconductor storage device comprising:
first to fifth word lines extending in a first direction and adjoining in an order from the first to fifth word lines;
first to fourth element regions extending in a tilt direction tilted with respect to the first direction, being on first to fourth lines adjoining in an order from the first to fourth lines, respectively, and isolated from each other by element isolation regions, the first element region intersecting with at least the first and second word lines, the second element region intersecting with at least the third and fourth word lines, the third element region intersecting with at least the second and third word lines, and the fourth element region intersecting with at least the fourth and fifth word lines;
a first MTJ element being between the first word line and the second word line, and above the first element region;
a second MTJ element being between the third word line and the fourth word line, and above the second element region;
a third MTJ element being between the second word line and the third word line, and above the third element region;
a fourth MTJ element being between the fourth word line and the fifth word line, and above the fourth element region;
a first bit line extending in a second direction orthogonal to the first direction, located above the first MTJ element and the second MTJ element, and electrically connected to the first and second MTJ elements; and a second bit line extending in the second direction, located above the third MTJ element and the fourth MTJ element, and electrically connected to the third and fourth MTJ elements, wherein the first MTJ element and the second MTJ element are on a substantially same line along the second direction, and the third MTJ element and the fourth MTJ element are on a substantially same line along the second direction.

14. The device of claim 13, further comprising first to fourth top electrode contacts on the first to fourth MTJ elements, respectively, wherein
the first bit line is located on the first and second top electrode contacts, and
the second bit line is located on the third and fourth top electrode contacts.

15. The device of claim 13, further comprising:
a first connection portion being between the second word line and the third word line, and on an end of the first element region and an end of the second element region; and
a second connection portion being between the third word line and the fourth word line, and on an end of the third element region and an end of the fourth element region.

16. The device of claim 15, further comprising:
a first source line contact on an end of the first connection portion between the second word line and the third word line;
a second source line contact on an end of the second connection portion between the third word line and the fourth word line;
a first source line extending in the second direction and connected to the first source line contact; and
a second source line extending in the second direction and connected to the second source line contact.

17. The device of claim 13, wherein a distance between the first MTJ element and the second MTJ element is substantially equal to a distance between the third MTJ element and the fourth MTJ element.

18. The device of claim 13, wherein the second and third word lines are located between the first MTJ element and the second MTJ element and the third and fourth word lines are located between the third MTJ element and the fourth MTJ element in a planar layout.

19. The device of claim 13, wherein the first to fourth MTJ elements are provided to correspond to intersections between two word lines and one bit line, respectively.

20. The device of claim 13, further comprising:
a third connection portion in a central portion of the first element region between the first word line and the second word line;
a fourth connection portion in a central portion of the second element region between the third word line and the fourth word line;
a fifth connection portion in a central portion of the third element region between the second word line and the third word line; and
a sixth connection portion in a central portion of the fourth element region between the fourth word line and the fifth word line.

* * * * *